United States Patent [19]
Yanagisawa et al.

[11] Patent Number: 5,699,058
[45] Date of Patent: Dec. 16, 1997

[54] ABSOLUTE ENCODER GENERATING PHASE-SHIFTED TRIANGULAR WAVEFORMS TO PRODUCE MULTI-BIT SIGNALS

[75] Inventors: Mitsuru Yanagisawa; Takumi Fukuda, both of Tokyo, Japan

[73] Assignee: Copal Company Limited, Tokyo, Japan

[21] Appl. No.: 402,494

[22] Filed: Mar. 13, 1995

[30] Foreign Application Priority Data

Mar. 17, 1994 [JP] Japan ................................. 6-072779
Mar. 17, 1994 [JP] Japan ................................. 6-072780

[51] Int. Cl.⁶ .................................................. H03M 1/22
[52] U.S. Cl. ............................................ 341/13; 341/1
[58] Field of Search .......................... 341/1, 2, 3, 4, 341/5, 6, 7, 8, 9, 10, 11, 12, 13, 14, 15, 16, 17

[56] References Cited

U.S. PATENT DOCUMENTS

| | | | |
|---|---|---|---|
| 3,487,400 | 12/1969 | Ludewig, Jr. et al. | |
| 4,465,373 | 8/1984 | Tamaki et al. | 356/374 |
| 4,524,347 | 6/1985 | Rogers | 340/347 |
| 4,623,831 | 11/1986 | Sakamoto et al. | 318/799 |
| 4,870,559 | 9/1989 | Hyatt | 364/130 |
| 4,893,121 | 1/1990 | Gasiunas | 341/15 |
| 4,942,394 | 7/1990 | Gasiunas | 340/870.31 |
| 4,970,511 | 11/1990 | Mills | 341/13 |
| 4,978,654 | 12/1990 | Koike | 341/1 |
| 5,068,529 | 11/1991 | Ohno et al. | 250/231 |
| 5,438,193 | 8/1995 | Takagi et al. | 250/231.18 |

FOREIGN PATENT DOCUMENTS

| | | | |
|---|---|---|---|
| 0042179 | 12/1981 | European Pat. Off. | 341/9 |
| 0143354 | 6/1985 | European Pat. Off. | 341/7 |

OTHER PUBLICATIONS

IBM Technical Disclosure Bulletin vol. 14 No. 3 p. 734, Aug. 1971.

*Primary Examiner*—Jeffrey A. Gaffin
*Assistant Examiner*—Jason A. Vick
*Attorney, Agent, or Firm*—Sixbey Friedman Leedom & Ferguson; Thomas W. Cole

[57] ABSTRACT

An absolute encoder is provided with a movable member, which may be a disc, a photodetector and a processing circuit. The movable member has a plurality of tracks T arranged from higher to lower orders, each track having a bright and dark pattern. The photodetectors A1–A4 receive a light through the bright and dark patterns to output triangular detection signals A1–A4 associated with the track T. The processing circuit processes the detection signals A1–A4 to produce bit signals P1–P3 which indicate a position of the movable member. The processing circuit is provided with an input unit 1, a comparator unit 2 and a logic unit 3. The input unit 1 receives the detection signals A1–A4 for producing a plurality of triangular wave signals having the same period but different phases. The comparator unit 2 comparatively processes the triangular wave signals with each other to produce a plurality of rectangular wave signals having different phases. The logic unit 3 logically processes the rectangular wave signals with each other to output at least three bit signals P1–P3 from one track.

37 Claims, 16 Drawing Sheets

| TRACK \ ADDRESS | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 |  |  | ▨ | ▨ |  | ▨ | ▨ |  | ▨ |  | ▨ | ▨ |  | ▨ | ▨ | ▨ |
| 1 |  |  |  | ▨ | ▨ | ▨ | ▨ |  | ▨ | ▨ |  | ▨ |  |  | ▨ | ▨ |
| 2 |  |  |  |  | ▨ | ▨ | ▨ | ▨ |  | ▨ | ▨ | ▨ |  | ▨ | ▨ | ▨ |
| 3 |  |  |  |  |  |  |  |  | ▨ | ▨ | ▨ | ▨ | ▨ | ▨ | ▨ | ▨ |

| TRACK \ ADDRESS | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 |  | ▨ | ▨ |  | ▨ | ▨ |  | ▨ | ▨ |  | ▨ | ▨ |  | ▨ | ▨ |  |
| 1 |  |  | ▨ | ▨ | ▨ |  |  | ▨ | ▨ | ▨ |  | ▨ | ▨ | ▨ |  |  |
| 2 |  |  |  | ▨ | ▨ | ▨ | ▨ | ▨ | ▨ |  | ▨ | ▨ | ▨ | ▨ |  |  |
| 3 |  |  |  |  | ▨ | ▨ | ▨ | ▨ | ▨ | ▨ | ▨ | ▨ | ▨ | ▨ | ▨ | ▨ |

ABSOLUTE ENCODER GENERATING PHASE-SHIFTED TRIANGULAR WAVEFORMS TO PRODUCE MULTI-BIT SIGNALS

BACKGROUND OF THE INVENTION

The present invention relates to an absolute encoder for outputting an absolute positional signal in the form of a parallel bit code representative of an angular position of an encoder plate such as a rotary disc even though the rotary disc is held stationary.

The encoder is widely utilized for a positional detection of a robot arm or else, and is constructed to read a scale of the encoder plate attached to a rotation shaft of a motor, by means of a photodetector. The positional detection encoder includes an incremental type and an absolute type. The former type is constructed such as to read a position of the rotary disc by counting an incremental pulse with reference to an origin of the rotary disc. The latter type undergoes the positional detection by reading a code formed on the rotary disc regardless of a mechanical state thereof. Therefore, the incremental type needs to rotate at most one cycle to restore the origin when restarting the encoder operation after a power source has been shut down, whereas the absolute type advantageously does not need the origin restoring operation because the position can be instantly read without moving the rotary disc when the power source is recovered.

FIG. 18 shows a typical structure of the conventional absolute encoder. A rotary disc 101 is formed thereon with a plurality of concentric tracks 102–105. Each track is comprised of an annular slit pattern which is bit-coded according to a digital code system indicative of an absolute position of the rotary disc 101. A photodetector array 106 is opposed to one side of the rotary disc 101, and a photo-emitter such as an LED 108 is opposed to the other side of the disc through a stationary slit plate 107. The slit pattern formed in the rotary disc 101 selectively passes and cuts off a light beam from the LED 108 so that the photodetector array 106 outputs detection signals according to a light intensity variation on respective tracks of the array 106. These detection signals are processed so as to read the angular absolute position or angular address of the rotary disc 101. Namely, this address is represented by the aforementioned digital code.

There have been known various digital code systems for representing an address. FIG. 19 schematically shows a slit pattern formed according to a regular binary code which is one example of the digital code systems. The illustrated pattern diagram indicates track numbers in a left column and addresses in a top row. The slit pattern of each track is binarily coded, and is composed of bright and dark sections. In this example, there are provided four tracks corresponding to four bits so as to represent $2^4=16$ number of absolute addresses. Such a regular binary code is a basic arrangement in the digital process. However, at a transition from one address to another address, switching between adjacent bright and dark sections may occur concurrently at two or more tracks. It is quite difficult to just concurrently detect respective transitions, thereby causing a drawback that a reading error may be generated by transitional fluctuation of detection timings.

FIG. 20 shows a Gray code which is designed to remove the above noted drawback. As seen from the pattern diagram, the Gray code is characterized in that the switching between adjacent bright and dark sections occurs only on one track at every transition of the addresses in contrast to the regular binary code, thereby effectively avoiding the reading error. However, the Gray code requires a multiple of tracks corresponding to a number of bits likewise the regular binary code. Therefore, as the bit number is increased to multiply addresses for achieving higher resolution power, a multiple of tracks are arranged in parallel manner along a radial direction of the rotary disc to thereby hinder downsizing of the absolute encoder.

FIG. 21 shows a slit pattern formed according to a binary coded quaternary system which can effectively reduce a number of tracks by half. A pair of tracks "0" and "1" are assigned with two binary bits for representing a quaternary lower order. For example, addresses "0"–"3" belonging to a first group are discriminated from each other by the quaternary numbers of the lower order. Similarly, addresses "4"–"7" belonging to a second group are also discriminated from each other by the quaternary numbers of the lower order. The same is true for the remaining third and fourth groups. Another pair of tracks "2" and "3" are assigned with two binary bits for representing a higher order of the quaternary number. The first, second, third and fourth groups are discriminated from each other by the higher order of the quaternary numbers. This binary coded quaternary system can be readily converted into the regular binary system by a simple logical computation.

FIG. 22 shows two different arrangements of a photodetector array for reading the binary coded quaternary slit pattern. A left photodetector array 110 has four photodetectors arranged in line correspondingly to the respective tracks "0"–"3". On the other hand, a right photodetector array 111 has a pair of photodetectors arranged along the track "1" by a phase difference of 90° with each other relative to the periodic slit pattern of the track "1". This pair of photodetectors can read a quaternary number of the lower order. Similarly, another pair of photodetectors are arranged along the track "3" by a phase difference of 90° with each other so as to read a quaternary number of the higher order. By such an arrangement, unnecessary tracks "0" and "2" can be eliminated to thereby reduce the number of tracks by half. To facilitate better understanding to this point, supplementary description is given again with reference to FIG. 21. The pair of tracks "0" and "1" have periodic slit patterns having the same period but a relative phase difference of 90°. Accordingly as illustrated by FIG. 22, the first pair of photodetectors are shifted from each other by the phase difference of 90° to enable reading of all the information contained in the tracks "0" and "1". Namely, the first pair of photodetectors can receive four combinations of bright and bright, bright and dark, dark and bright, and dark and dark to read the quaternary information. In similar manner, the tracks "2" and "3" shown in FIG. 21 have periodic slit patterns having the same period but a relative phase difference of 90°. Therefore, the arrangement of the photodetector array 111 of FIG. 22 can read quaternary information of the higher order.

SUMMARY OF THE INVENTION

As mentioned above, the binary coded quaternary system can reduce the number of the tracks by half. Stated otherwise, two bit signals can be derived from on track. However, if the bit number is further increased in order for higher resolution power, the track number considerably increases. Thus, the binary coded quaternary system is still not sufficient to avoid scale-up and cost-up of the absolute encoder. In view of this, an object of the present invention is to derive more number of bit signals from one track. From another point of view, the above mentioned binary coded quaternary system has bright and dark patterns which are concurrently changed across two or more tracks in contrast to the previously mentioned Gray code system. It would be difficult to coincidentally detect all of changes between bright and dark sections. Such a detection timing gap may cause a reading error of the positional addresses. In view of this, another object of the invention is to synchronize lower and higher order tracks to eliminate the reading error.

In order to solve problems of the prior art and to achieve the above noted objects, according to the invention, an absolute encoder basically comprises a movable member, a photodetector and a processing circuit. The movable member has a plurality of tracks arranged from higher to lower orders, each track having a bright and dark pattern. A plurality of photodetectors receive a light through the bright and dark pattern of one track to output detection signals associated to the one track. The processing circuit processes the detection signals to produce bit signals which indicate a position of the movable member. Characterizingly, the processing circuit comprises input means, comparator means and logic means. The input means is receptive of the detection signals for producing a plurality of triangular wave signals having the same period but different phases. The comparator means comparatively processes the triangular wave signals with each other to produce a plurality of rectangular wave signals having different phases. The logic means logically processes the rectangular wave signals with each other to output at least three bit signals from one track. Preferably, the processing circuit is assigned to a higher order track and includes modulator means connected between the input means and the comparator means for modulating the triangular wave signals according to a periodic signal which is fed from another processing circuit assigned to a lower order track so as to synchronize a bit signal of the higher order track with another bit signal of the lower order track. This modulator means comprises means for logically processing a rectangular signal fed back from the comparator means with the periodic signal to form a sync signal, and means for adding the sync signal and respective one of the triangular wave signals with one another by a given ratio to produce the modulated triangular wave signals. In one expedience, the input means includes means for adding or subtracting a pair of detection signals having a trapezoidal waveform and a phase difference of 90° with each other so as to produce a triangular wave signal. Alternatively, detection signals having a triangular waveform and having a phase difference of 90° are used for the triangular wave signals as they are. In another expedience, the input means includes means for inverting a detection signal to form an opposite phase signal, and means for processing another detection signal and the opposite phase signal so as to produce a triangular wave signal. The bright and dark pattern formed in the movable member comprises, for example, a gradation pattern which gradually changes from bright to dark, effective to enable the input means to form a slope of the triangular wave signal. For example, this gradation pattern comprises an alternate arrangement of a bright segment and a dark segment such that a duty ratio thereof gradually changes along the track. Otherwise, the gradation pattern comprises a continuous gradation pattern such that an optical density continuously changes from bright to dark along the track. Further, the gradation pattern comprises a split gradation pattern having a bright section and a dark section, which are separated from each other by a split line extending obliquely in the track. The split line comprises a diagonal linear line formed in a straight track if the movable member moves linearly. Otherwise, the split line comprises a vertical line formed in a circular track if the movable member moves rotationally.

According to the present invention, an array of the photodetectors is suitably arranged along one of parallel tracks to derive, for example, four number of triangular wave signals sequentially phase-shifted by 90°. The four triangular wave signals are subjected to the comparative processing with one another to produce four number of rectangular wave signals sequentially phase-shifted by 90°. These four rectangular wave signals are subjected to the logical processing to produce three number of bit signals per one track. Alternatively, eight number of triangular wave signals having a successive phase difference of 45° may be derived from one track. These eight triangular wave signals are subjected to the comparing process and the logical process in similar manner so as to produce four number of bit signals per one track. Further, each triangular wave signal is modulated in response to a periodic signal originating from a lower order track so as to synchronize a lower order bit signal and a higher order bit signal with each other. In practice, the periodic signal from the lower order track is logically processed with one rectangular wave signal which is fed back from the comparator means of the higher order track to form a sync signal. Then, each triangular wave signal of the higher order track is added with the sync signal by a given ratio to form the modulated triangular wave signal.

In another aspect of the present invention, basically, an absolute encoder comprises a movable member, a photodetector and a processing circuit. The movable member has a plurality of tracks arranged from higher to lower orders, each track having a bright and dark pattern. The photodetector receives a light through the bright and dark pattern to output a detection signal associated to each track. The processing circuit processes the detection signal to produce a bit signal which indicates a position of the movable member. The processing circuit is characterizingly comprised of wave-forming means, comparator means and logic means. The wave-forming means is receptive of the detection signals for producing a plurality of primary wave signals having the same period but different phases which are sequentially shifted by a given shift amount and for further producing a plurality of secondary wave signals which have a different waveform than the primary wave signals and which are phase-shifted from the primary wave signals by half of the given shift amount. The comparator means comparatively processes the primary and secondary wave signals with each other to produce a plurality of rectangular wave signals having different phases. The logic means logically processes the rectangular wave signals with each other to output at least four bit signals from one track. Preferably, the wave-forming means comprises means for producing a plurality of primary wave signals having a triangular waveform and for further producing secondary wave signals having a trapezoidal waveform which is obtained by either of adding and subtracting the primary wave signals with one another. In one expedience, the processing circuit is assigned to a higher order track and includes modulator means connected between the wave-forming means and the comparator means for modulating the primary and secondary wave signals according to a periodic signal which is fed from another processing circuit assigned to a lower order track so as to synchronize a bit signal of the higher order track with another bit signal of the lower order track. In practice, the modulator means comprises means for logically processing a rectangular signal fed back from the comparator means with the periodic signal to form a sync signal, and means for adding the sync signal and respective one of the primary and secondary wave signals with one another by a given ratio to produce the modulated primary and secondary wave signals.

According to the present invention, four number of primary triangular wave signals having the same period and being sequentially phase-shifted by a given shift amount are formed from the detection signals. Further, these primary triangular wave signals are subjected to the adding/subtracting process to synthesize, for example, two number of secondary trapezoidal wave signals which are phase-shifted by half of the given shift amount. In total, six number of the triangular and trapezoidal wave signals are subjected to the comparative processing with one another to produce eight number of rectangular wave signals sequentially phase-shifted from one another. These eight rectangular wave signals are subjected to the logical processing to produce at least four number of bit signals per one track. Further, each of the triangular and trapezoidal wave signals is modulated in response to a periodic signal originating from a lower order track so as to synchronize a lower order bit signal and a higher order bit signal with each other. Namely, the periodic signal from the lower order track is logically processed with one rectangular wave signal which is fed back from the comparator means corresponding to the higher order track to form a sync signal. Then, each of the triangular and trapezoidal wave signals of the higher order track is added with the sync signal by a given ratio to form the modulated triangular and trapezoidal wave signals.

DETAILED DESCRIPTION OF THE INVENTION

Figure 1A:
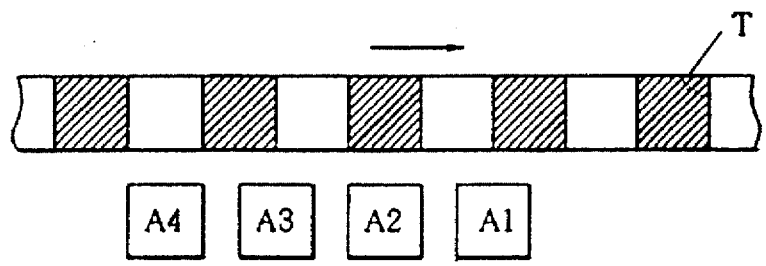
FIGS. 1A, 1B and 1C are a slit pattern diagram, a waveform diagram of detection signals and a circuit block diagram, respectively, illustrating a first embodiment of the inventive absolute encoder.
Figure 1B:
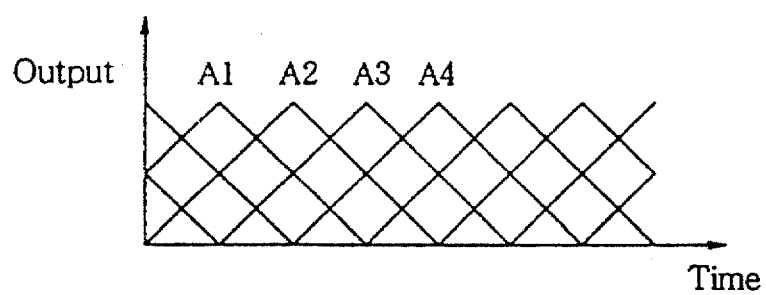
Figure 1C:
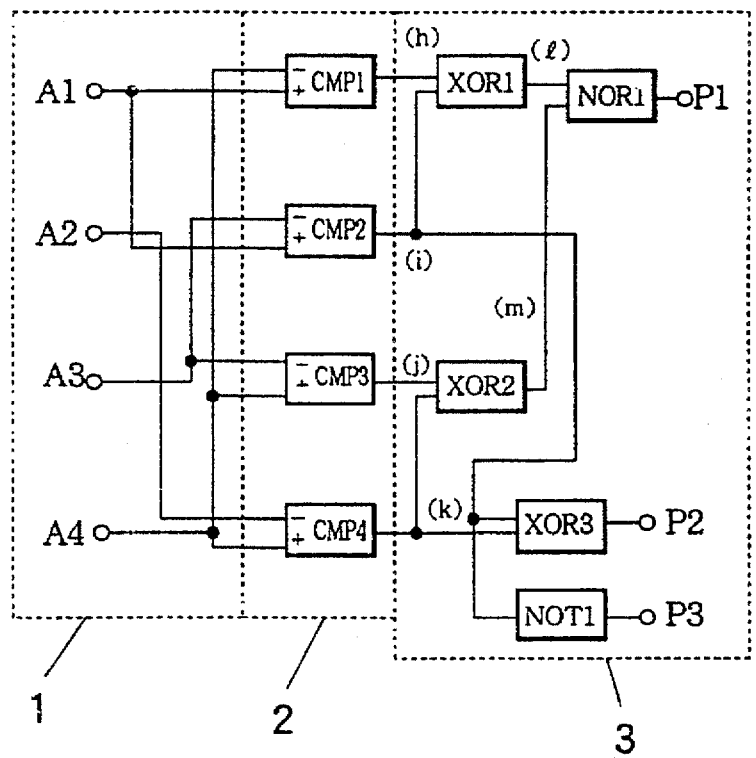

Hereinafter, detailed description is given for preferred embodiments of the present invention in conjunction with the drawings. FIGS. 1A, 1B and 1C schematically show a first embodiment of the inventive absolute encoder. The absolute encoder has a movable member formed with parallel tracks, each of which is formed with a periodic bright and dark pattern. FIG. 1A shows one track T. As indicated by the arrow, this track T linearly moves in a linear encoder. In another form, an annular track is formed on a movable disk member to move rotationally. Four number of photodetectors A1, A2, A3 and A4 are arranged along the one track T to receive an illuminating light through the bright and dark pattern to output detection signals. In this embodiment, the photodetectors A1–A4 have a length identical to half of one period of the bright and dark pattern along the track. Further, the photodetectors A1, A2, A3 and A4 are arranged sequentially such that their phase difference is set to 90° (¼ of the period of the bright and dark pattern).

FIG. 1B shows a time-variation of outputs from the photodetectors. The photodetectors A1–A4 output detection signals having triangular waveforms which are sequentially phase-shifted by 90°. Hereinafter, a photodetector and a corresponding detection signal may be denoted by the same reference in this specification in order to facilitate reading of the description.

FIG. 1C shows a processing circuit connected to the photodetectors. The processing circuit processes the detection signals to produce bit signals so as to read a position of the movable member. As shown in the figure, the processing circuit has an input part 1, a comparator part 2 and a logic part 3. The input part 1 receives the detection signals to provide a plurality of triangular signals having the same period but having different phases. In this embodiment, four number of the detection signals A1, A2, A3 and A4 having the triangular waveform are received as they are to directly provide respective triangular signals. Therefore, the respective triangular signals are also denoted by the references A1, A2, A3 and A4 in this embodiment. The comparator part 2 includes four number of comparators CMP1, CMP2, CMP3 and CMP4. The part 2 comparatively processes the triangular wave signals A1–A4 with each other to produce four number of rectangular signals which are phase-shifted from one another by 90°. The logic part 3 is composed of three exclusive logical summation devices XOR1, XOR2 and XOR3, one negative logical summation device NOR1 and one negative device NOT1. The last part 3 logically processes the four rectangular wave signals with each other to output three number of bit signals P1, P2 and P3.

Figure 2:
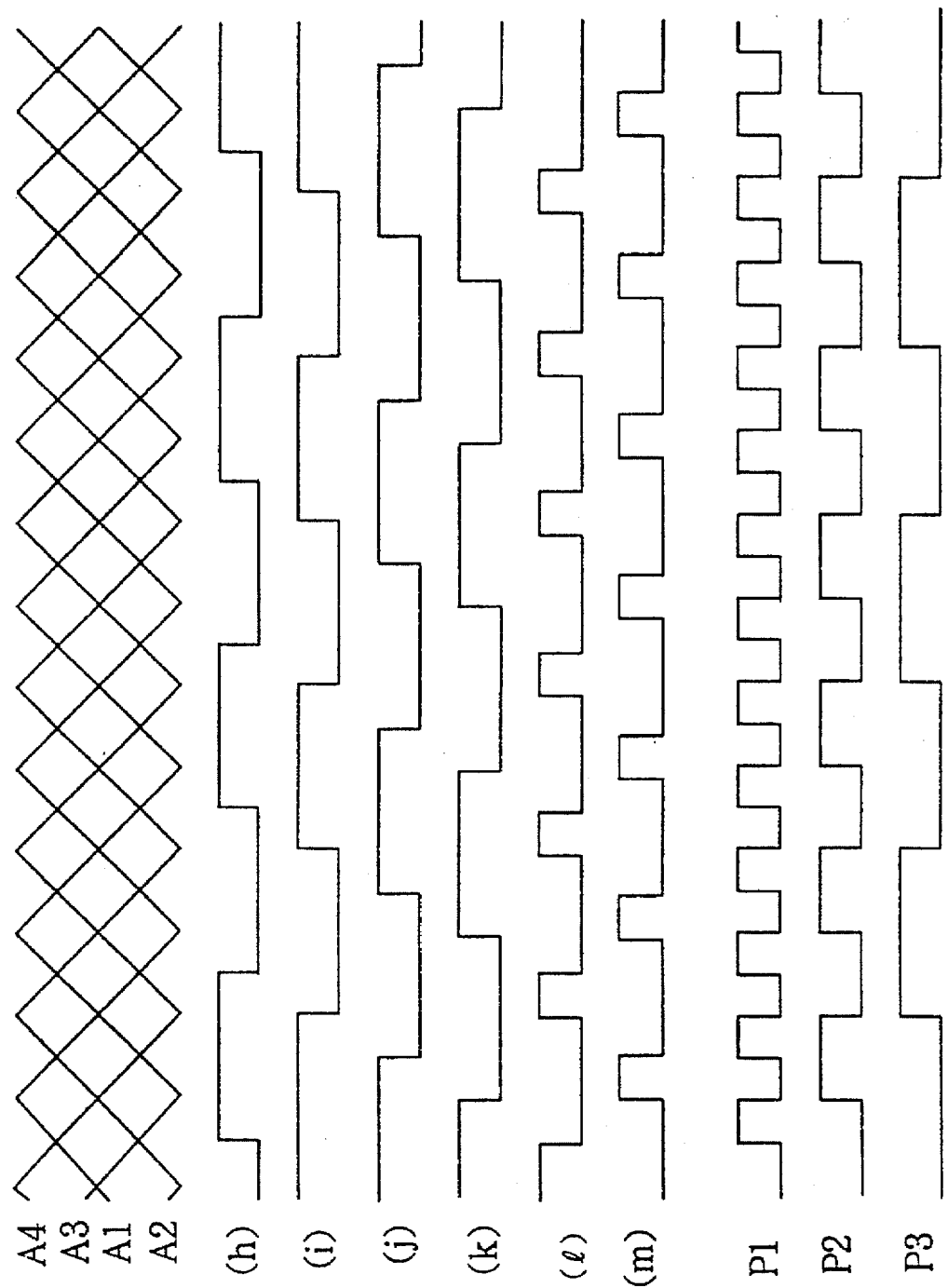
FIG. 2 is a waveform diagram illustrating operation of the first embodiment of the absolute encoder shown in FIGS. 1A, 1B and 1C.

Referring to FIG. 2, detailed description is given for operation of the processing circuit shown in FIG. 1C. As shown, the triangular wave signals A1, A2, A3 and A4 are sequentially phase-shifted by 90°. The CMP1 compares A1 and A2 with each other to derive a first rectangular wave signal (h). In similar manner, CMP2 compares A1 and A3 with each other to produce a second rectangular wave signal (i). CMP3 compares A4 and A3 with each other to obtain a third rectangular wave signal (j). CMP4 compares A4 and A2 with each other to obtain a fourth rectangular wave signal (k). These four rectangular wave signals are sequentially phase-shifted from each other by 45°. XOR1 carries out the exclusive logical summation of the first rectangular wave signal (h) and the second rectangular wave signal (i) to derive a first intermediate signal (1). Further, XOR2 carries out the exclusive logical summation of the third and fourth triangular wave signals (j) and (k) to obtain a second intermediate signal (m). NOR1 carries out the negative logical summation of the first and second intermediate signals (1) and (m) to produce the first bit signal (low bit signal) P1. Further, XOR3 carries out the exclusive logical summation of the second and fourth rectangular wave signals (i) and (k) to produce the second bit signal (middle bit signal) P2. Lastly, NOT1 carries out the negative operation of the second rectangular wave signal (i) to produce the third bit signal (high bit signal) P3. By such a manner, the set of three bit signals P1–P3 can be derived from the one track T.

Figure 3:
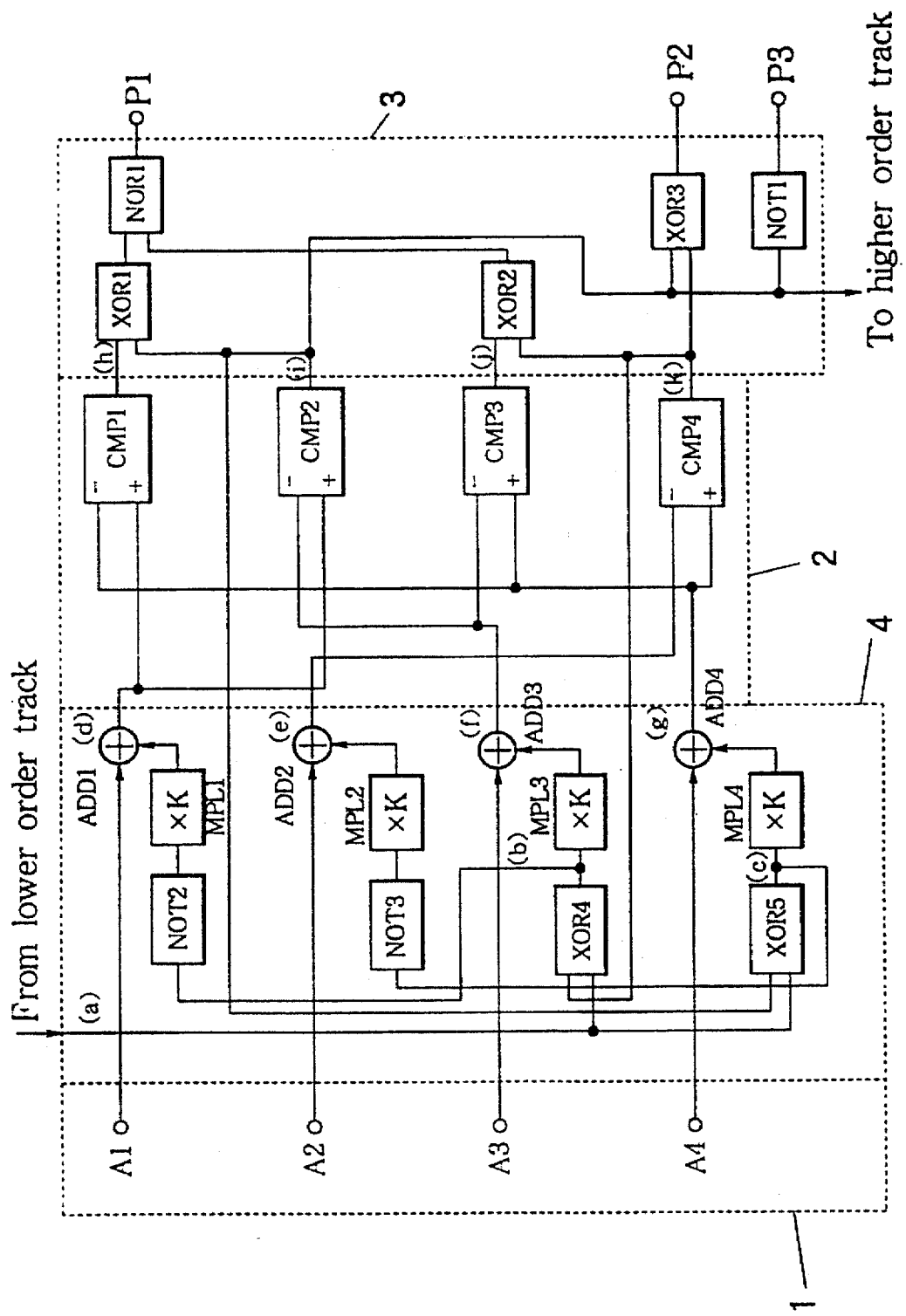
FIG. 3 is a circuit diagram showing a second embodiment of the inventive absolute encoder.

FIG. 3 shows another processing circuit involved in a second embodiment of the inventive absolute encoder. Basically, the present processing circuit has a similar structure as that of the previous processing circuit shown in FIG. 1C. Thus, corresponding parts are denoted by the same references for better understanding. A difference is in that a modulator part 4 is interposed between the input part 1 and the comparator part 2. The modulator part 4 modulates the four triangular wave signals A1, A2, A3 and A4 in response to a periodic signal (a) transferred from another processing circuit assigned to a lower order track (which is lower by one order than the track T shown in FIG. 1A) so as to synchronize the higher order bit signals (derived from the track T) with a lower order bit signal. The modulator part 4 is comprised of two exclusive logical summation elements XOR4 and XOR5, four multiplication elements MPL1, MPL2, MPL3 and MPL4, and four adders ADD1, ADD2, ADD3 and ADD4. The four multiplicators are set with a multiplication factor K. The pair of XOR4 and XOR5 constitute together a means for carrying out the exclusive logical summation of the periodic signal (a) from the lower order track and the respective one of the rectangular wave signals (i) and (k) which are fed back from the comparator part 2 so as to form sync signals (b) and (c), respectively. Further, the set of NOT2, NOT3, MPL1, MPL2, MPL3, MPL4, ADD1, ADD2, ADD3 and ADD4 constitute altogether a means for adding the sync signal (b) or (c) to the respective one of the triangular wave signals A1, A2, A3 and A4 by a given ratio to produce four modulated triangular wave signals (d), (e), (f) and (g). These four modulated triangular wave signals are successively processed by the comparator part 2 and the logic part 3 to derive the three bit signals P1, P2 and P3. These three bit signals P1–P3 of the higher order are synchronized with the periodic signal (a) provided from the lower order track. On the other hand, the rectangular wave signal (i) outputted from CMP2 contained in the comparator part 2 is provided as a next periodic signal to a next processing circuit of a higher order track. By such a manner, the complete synchronization is established throughout all of the parallel tracks.

Figure 4:
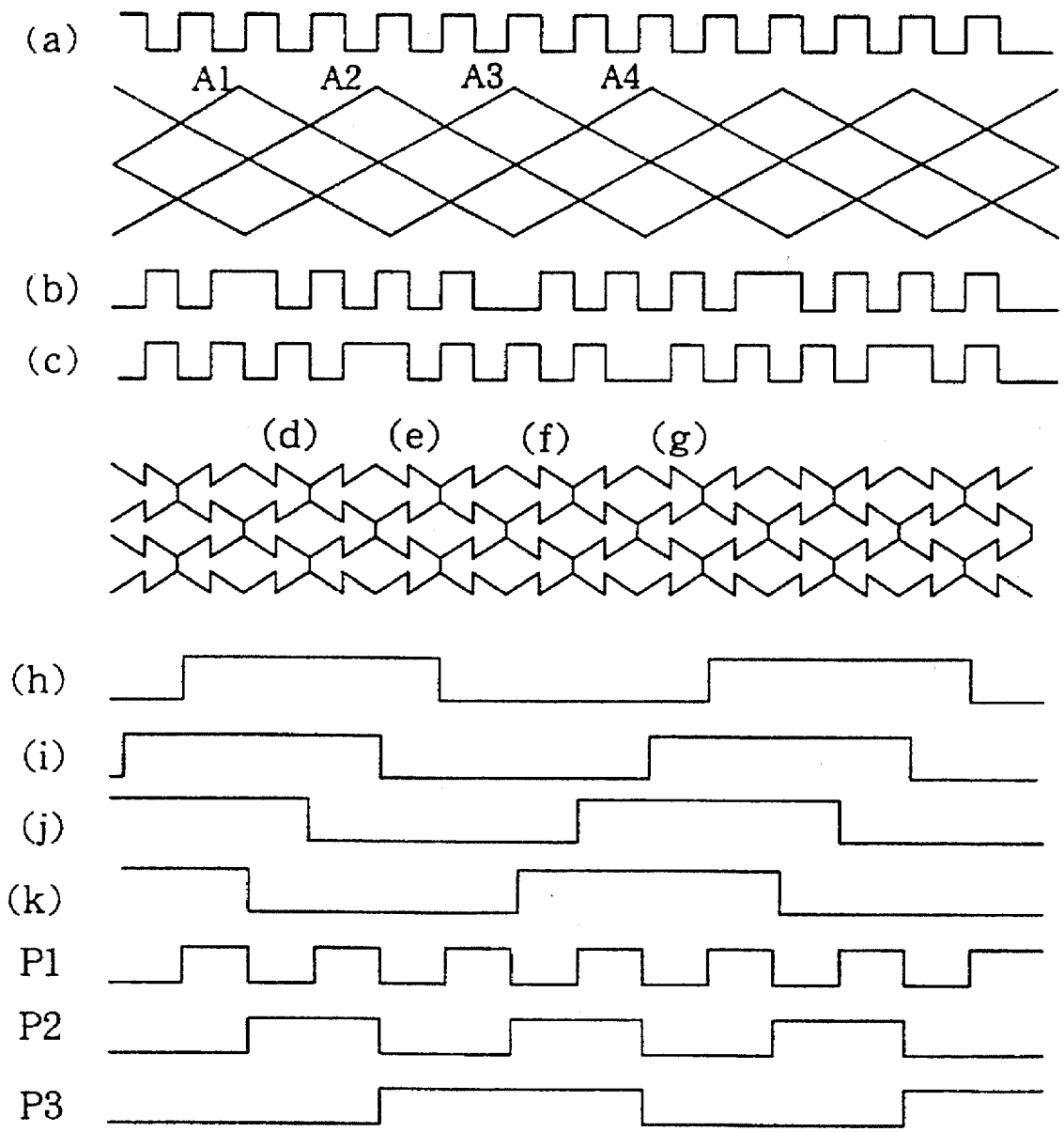
FIG. 4 is a waveform diagram illustrating operation of the second embodiment shown in FIG. 3.

FIG. 4 is a timing chart illustrating the operation of the processing circuit shown in FIG. 3. As shown, the periodic signal (a) provided from the lower order track has a rectangular waveform and a given period. On the other hand, the four triangular wave signals A1, A2, A3 and A4 have a period 8 times as much as the periodic signal (a), and are sequentially phase-shifted by 90°. First, XOR4 carries out the exclusive logical summation of the periodic signal (a) and the rectangular signal (k) fed back from CMP4 so as to produce the first sync signal (b). The first sync signal (b) has leading and trailing edges which are synchronized with those of the periodic signal (a). The other XOR5 carries out the exclusive logical summation of the periodic signal (a) and the rectangular wave signal (i) fed back from CMP2 to produce the second sync signal (c). The second sync signal (c) has also leading and trailing edges in synchronization with the periodic signal. Then, the first sync signal (b) is subjected to the negative process by NOT2, and is further subjected to the multiplication process by MPL1 with the factor K. The processed result and the triangular wave signal A1 are added to each other by ADD1 to produce the modulated triangular wave signal (d). Namely, the sync signal and the original triangular wave signal are added to each other by the given ratio K to form the modulated triangular wave signal. The modulated triangular wave signal (d) has a vertical step in a slope in synchronization with the periodic signal (a). In similar manner, the second sync signal (c) is subjected to the negative process by NOT3, and is then multiplicated by MPL2 with the factor K. This result and the original triangular wave signal A2 are added to each other by ADD2 to produce the corresponding modulated triangular wave signal (e). The modulated triangular wave signal (e) has also a vertical step synchronized with the periodic signal (a). Further, the first sync signal (b) is multiplied by K through MPL3, and is then added to the triangular wave signal A3 through ADD3 to form the modulated triangular wave signal (f). Still further, the second sync signal (c) is multiplied by K through MPL4 and thereafter added to the last triangular wave signal A4 by ADD4 to form the modulated triangular wave signal (g).

Next, the modulated triangular wave signals (d) and (g) are compared to each other by CMP1 in the comparator part 2 to thereby produce the first rectangular wave signal (h). The pair of the modulated triangular wave signals (d) and (g) are crossed to each other at their steps to exactly invert the output of CMP1 even if a certain variation of amplitude and phase occurs in the triangular wave signal. Consequently, the leading and trailing edges of the rectangular wave signal (h) are perfectly synchronized with the periodic signal (a). Similarly, the pair of the modulated triangular wave signals (d) and (f) are compared with each other by CMP2 to produce the second rectangular wave signal (i). As described before, the rectangular wave signal (i) is fed back to the modulator part 4. The pair of the modulated triangular wave signals (g) and (f) are compared with each other by CMP3 to produce the third rectangular wave signal (j). The last pair of the modulated triangular wave signals (g) and (e) are compared to each other by CMP4 to form the fourth rectangular wave signal (k). As mentioned before, the fourth rectangular wave signal (k) is fed back to the modulator part 4. These comparators CMP1, CMP2, CMP3 and CMP4 compare a pair of modulated triangular wave signals which have a phase difference of 90° or 180° and which cross with each other just at their vertical steps, thereby ensuring the synchronization with the periodic signal (a). The thus obtained rectangular wave signals (h)–(k) are logically processed by the logic part 3 to derive the three bit signals P1, P2 and P3 in manner similar to the first embodiment. The first bit signal P1 has a period twice as much as the periodic signal (a). The second bit signal P2 has a period four times as much as the periodic signal (a). The third bit signal P3 has a period eight times as much as the periodic signal (a). These bit signals are composed of a train of rectangular pulses each having leading and trailing edges exactly synchronized to the leading or trailing edge of the periodic signal (a).

Figure 5:
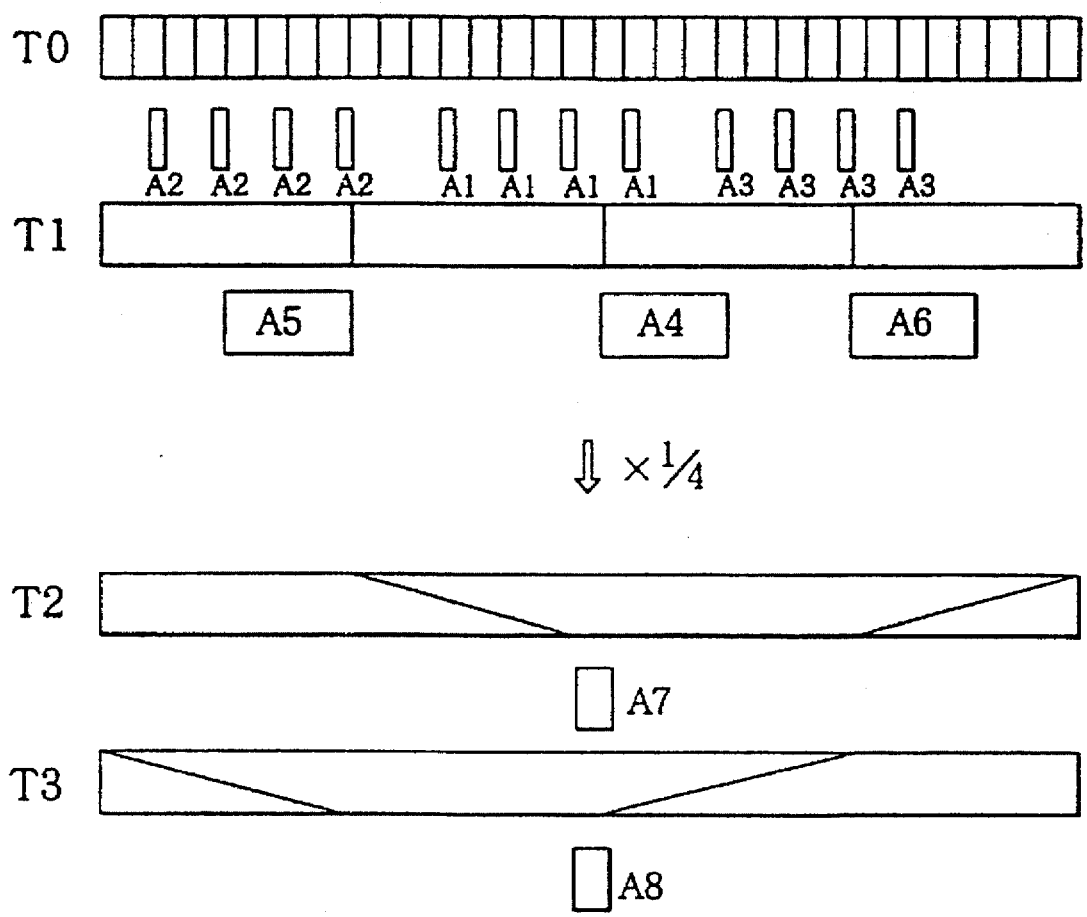
FIG. 5 is a track arrangement diagram showing a practical example of the inventive absolute encoder.

FIG. 5 shows one practical example of the inventive absolute encoder. A set of four parallel tracks T0, T1, T2 and T3 are formed in a movable member (encoder plate) from lower to higher orders so as to derive nine number of bit signals P0–P8 Namely, the absolute encoder has a certain positional resolution which realizes $2^9$ number of addresses. As shown in the figure, a first set of photodetectors A1, a second set of photodetectors A2 and a third set of photodetectors A3 are arranged along the lowest order track T0. Each set includes a plurality of the photodetectors (four numbers in this example) in order to increase a received light amount in total. These photodetectors A1, A2 and A3 have a length or span, in the track direction, dimensioned ¼ of one period of the bright and dark pattern. Therefore, the individual photodetector is narrower than the previous photodetector used in the FIG. 1A embodiment. Therefore, the photodetectors A1, A2 and A3 output a detection signal not having a triangular waveform but having a trapezoidal waveform. The set of photodetectors A1 and the set of photodetectors A2 have a relative phase difference of 90°. The set of photodetectors A1 and the set of photodetectors A3 have a relative phase difference of 180°. Three pieces of photodetectors A4, A5 and A6 are disposed along the track T1 next to the lowest order track T0. These photodetectors have a length, in the track direction, dimensioned ¼ of one period of the bright and dark pattern formed along the track T1. These photodetectors likewise output or generate a detection signal having a trapezoidal waveform. The photodetectors A4 and A5 have a spatial phase difference of 90°. The photodetectors A4 and A6 have a spatial phase difference of 180°. The next track T2 has a bright and dark pattern in a gradation form which gradually changes from bright to dark along the track, hence a corresponding photodetector A7 can output a detection signal having a trapezoidal waveform containing a slope. In this example, this gradation pattern comprises a split gradation pattern having a bright section and a dark section, which are separated from each other by a split line extending diagonally in the track. The split line comprises a diagonal linear line formed in the straight or linear track T2. The last track T3 has a bright and dark pattern which is shifted from the track T2 by a spatial phase angle of 90°, while a corresponding photodetector A8 is disposed in the same spatial phase relation to the photodetector A7. The bright and dark patterns formed in the tracks T2 and T3 have a period eight times as long as the bright and dark pattern formed in the track T1. For better illustration, the tracks T2 and T3 are drawn in the figure by a contraction rate of ¼ in the track direction relative to tracks T0 and T1.

Figure 6:
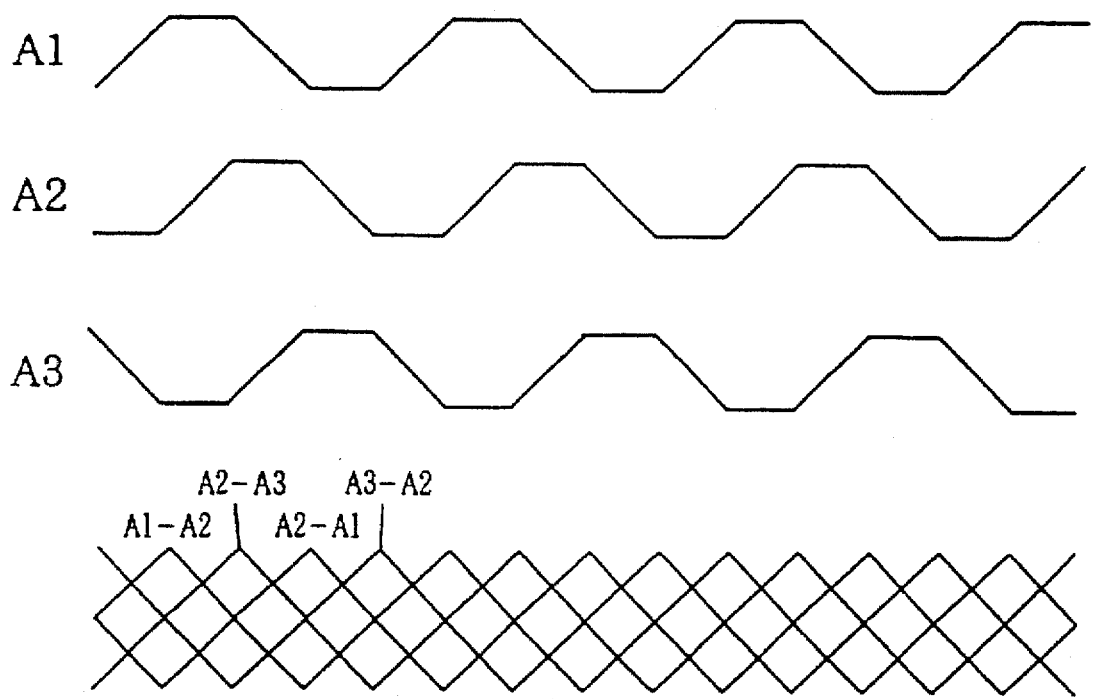
FIG. 6 is a waveform diagram illustrating operation of the FIG. 5 example.

FIG. 6 shows waveforms of detection signals outputted from the photodetectors A1, A2 and A3 shown in FIG. 5. As mentioned before, the detection signals A1, A2 and A3 have the trapezoidal waveform. The trapezoidal detection signals A1 and A2 are shifted from each other by an electric phase angle of 90°. The detection signals A2 and A3 are phase-shifted from each other by 180°. The pair of detection signals A1 and A2 are subjected to subtraction operation to produce a first triangular wave signal A1–A2. The pair of detection signals A2 and A3 are subjected to subtraction operation to produce a second triangular wave signal A2–A3. The detection signals A2 and A1 are subjected to subtraction operation to produce a third triangular wave signal A2–A1. Lastly, the detection signal A3 is subtracted by the detection signal A2 to produce a fourth triangular wave signal A3–A2. These four triangular wave signals have the same period but different phases which are sequentially shifted by 90°. Therefore, these four triangular wave signals A1–A2, A2–A3, A2–A1 and A3–A2 correspond to the previous four triangular wave signals A1, A2, A3 and A4 shown in FIG. 1B, respectively. In this example, the trapezoidal detection signals are specifically subjected to the mutual subtraction operation to form the triangular wave signals. In general, suitable addition and/or subtraction operation is applied to the initial detection signals to form desired triangular wave signals.

Figure 7:
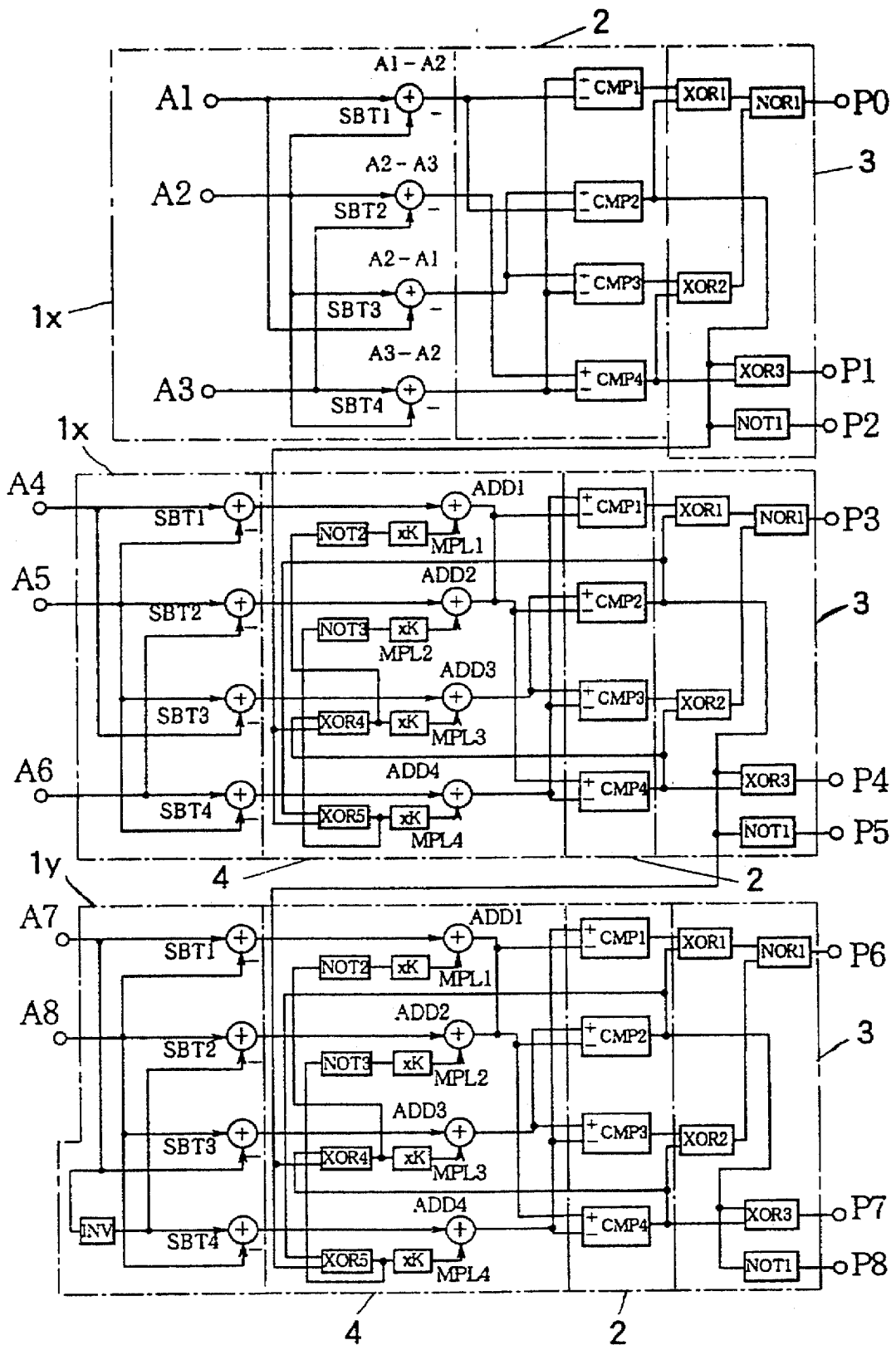
FIG. 7 is a block diagram showing construction of processing circuits integrated to the FIG. 5 example.

FIG. 7 shows a multi-stage structure of the processing circuits designed correspondingly to the track arrangement of FIG. 5. As shown, a first stage of the processing circuit is provided to the track T0 to output three bit signals P0, P1 and P2. This first processing circuit is assigned to the lowest order track T0 so that the synchronization process is not required. Therefore, the first processing circuit basically adopts the circuit structure shown in FIG. 1C. Corresponding elements are denoted by the same references for better understanding. One difference point is that an input part 1x contains four subtractors SBT1, SBT2, SBT3 and SBT4. As readily understood from FIG. 6, SBT1 carries out the subtraction between the trapezoidal detection signals A1 and A2 to produce the first triangular wave signal A1–A2. Similarly, SBT2 produces the second triangular wave signal A2–A3, SBT3 produces the third triangular wave signal A2–A1, and SBT4 produces the fourth triangular wave signal A3–A2. By such a manner, SBT1–SBT4 constitute a means for mutually subtracting and/or adding the trapezoidal detection signals A1, A2 and A3 having the relative phase difference of 90° to produce the first to fourth triangular wave signals.

The second stage of the processing circuit is provided to the second order track T1 shown in FIG. 5. This second processing circuit has basically the same structure as that shown in FIG. 3, and therefore contains the modulator part 4 for the synchronization operation. The second stage processing circuit has also the input part 1x comprised of SBT1–SBT4 likewise the first stage processing circuit. The second stage processing circuit processes the trapezoidal detection signals A4, A5 and A6 to output three bit signals P3, P4 and P5. The second stage processing circuit receives the periodic signal in the form the rectangular wave signal fed from CMP2 of the first stage processing circuit so as to modulate the four triangular wave signals by the received periodic signal to thereby establish the synchronization between P3–P5 and P0–P2. Namely, the modulated triangular wave signals are formed with vertical steps synchronized with the periodic signal fed from the lower order track. Therefore, as long as the modulated triangular wave signals cross with each other at their steps, no substantial reading error of the address occurs even when the phase and/or voltage level fluctuate in the detection signals.

The third stage processing circuit is provided to the pair of tracks T2 and T3 shown in FIG. 5. The third stage processing circuit has basically the same structure as that of the second stage processing circuit. A different point is in that an input partly contains an inverter INV. This inverter INV inverts the detection signal A7 to form an opposite phase signal. By such a construction, the third stage processing circuit processes the two detection signals A7 and A8 to output the three bit signals P6–P8. The third stage processing circuit carries out the synchronization operation based on the periodic signal transmitted from CMP2 of the second stage processing circuit so as to synchronize P6–P8 and P3–P5 with each other. In the highest order track, if the photodetectors A7 and A8 were designed likewise the photodetectors A1–A6, the photodetectors A7 and A8 should need an excessively long span dimensioned ¼ of one period of the elongated bright and dark pattern. In view of this, as shown in FIG. 5, the tracks T2 and T3 are formed with the gradation pattern of bright and dark, while the photodetectors A7 and A8 are scaled down to enable outputting of the trapezoidal detection signals. In such an arrangement, an edge of the trapezoid waveform may be rounded within the span of the photodetector. However, such a slight distortion of the waveform would not cause a substantial problem as long as the rounded edge does not coincide with the step of the modulated triangular wave signal.

Figure 8:
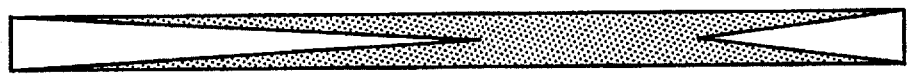
FIG. 8 is a schematic diagram showing a one example of a bright and dark pattern formed along a track.

FIG. 8 shows another example of the gradated bright and dark pattern. In this example, the bright and dark sections are separated from each other by two crossing split lines extending diagonally in the track.

Figure 9:
FIG. 9 is a schematic diagram showing another example of the bright and dark pattern.

FIG. 9 shows a further example of the gradation pattern. In this example, the gradation pattern comprises an alternate arrangement of a bright segment and a dark segment such that a duty ratio thereof gradually changes along the track to enable the photodetector to form a desired waveform slope of the detection signal. Such a gradation pattern can be applied not only to a transmittive slit plate but also to a reflective slit plate.

Figure 10:
FIG. 10 is a schematic diagram showing a further example of the bright and dark pattern.

FIG. 10 shows another example of the gradation pattern. In this example, an optical density of the gradation pattern continuously changes from bright to dark along the track.

Figure 11:
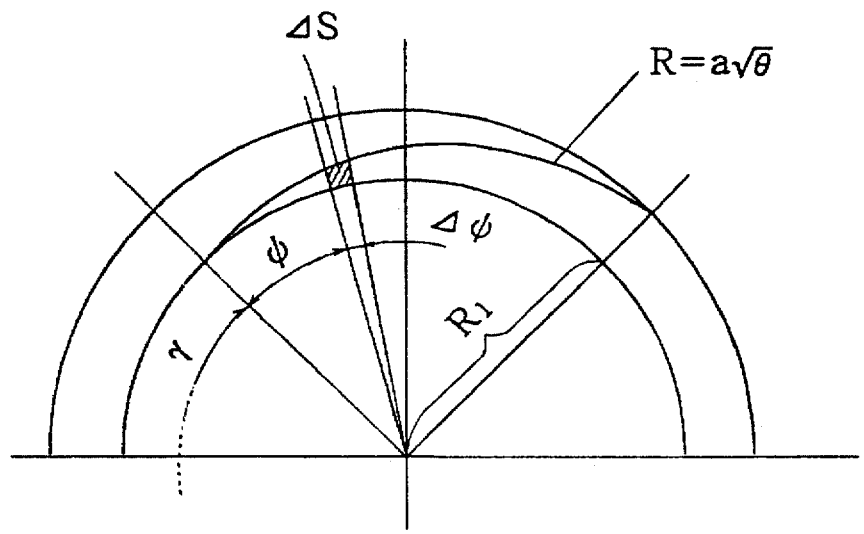
FIG. 11 is a schematic diagram showing a still further example of the bright and dark pattern.

These gradation patterns shown in FIGS. 8–10 are formed in the linear track. On the other hand, FIG. 11 shows an annular gradation pattern in which the split line separating the bright and dark sections is a vortical line formed in a circular track. When the vortical line passes over the photodetector, the outputted detection signal varies linearly to the rotation angle of the circular track. For this, the vortical line should be a spiral line designed to satisfy the following relation (1):

$$R = a \cdot \sqrt{\theta} \qquad (1)$$

wherein R denotes a radius, a denotes a constant, and $\theta$ denotes a rotational angle measured from a start point of the spiral line.

Hereinafter, the theoretical description will be given with reference to FIG. 11. As shown, an area $\Delta S$ of a hatched portion defined between $\phi$ and $\phi + \Delta\phi$ is given by the following relation (2).

$$\Delta S = (a \cdot \sqrt{\gamma + \phi} - R_1) \cdot \left( \frac{a \cdot \sqrt{\gamma + \phi} + R_1}{2} \right) \cdot \Delta\phi \qquad (2)$$

Then, the relation (2) is subjected to integral operation to calculate a projection area S to the photodetector provided that $\alpha$ denotes an angular span or width of the photodetector. The computation result is shown by the following formula (3).

$$\begin{aligned}
S &= \int_{\phi}^{\phi+\alpha} \Delta S \\
&= \int_{\phi}^{\phi+\alpha} (a \cdot \sqrt{\gamma + \phi} - R_1) \cdot \left( \frac{a \cdot \sqrt{\gamma + \phi} + R_1}{2} \right) d\phi \\
&= \frac{1}{2} \int_{\phi}^{\phi+\alpha} \{a^2(\gamma + \phi) - R_1^2\} d\phi \\
&= \frac{1}{2} \int_{\phi}^{\phi+\alpha} a^2 \phi \, d\phi \\
&= \frac{a^2}{4} (\alpha^2 + 2\alpha\phi)
\end{aligned} \qquad (3)$$

Consequently as understood from the relation (3), the projection area S onto a light receiving face of the photodetector is linearly proportional to the angle $\phi$.

Figure 12A:
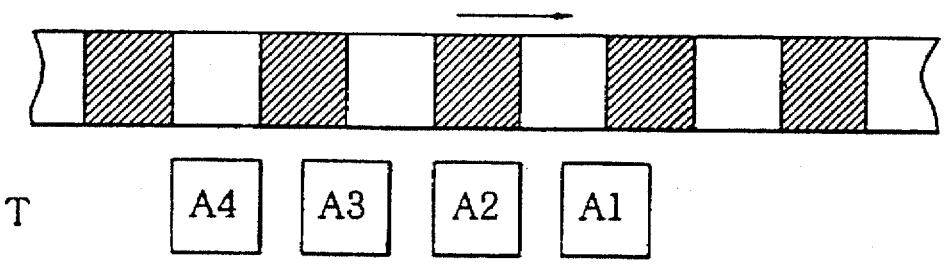
FIGS. 12A, 12B and 12C are a slit pattern diagram, a waveform diagram of detection signals and a circuit block diagram, respectively, illustrating a third embodiment of the inventive absolute encoder.
Figure 12B:
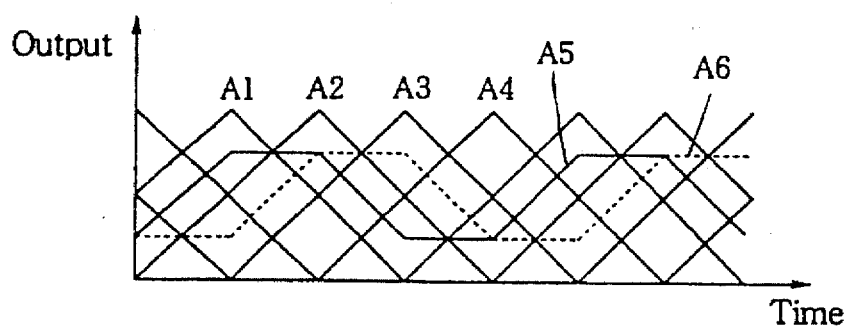
Figure 12C:
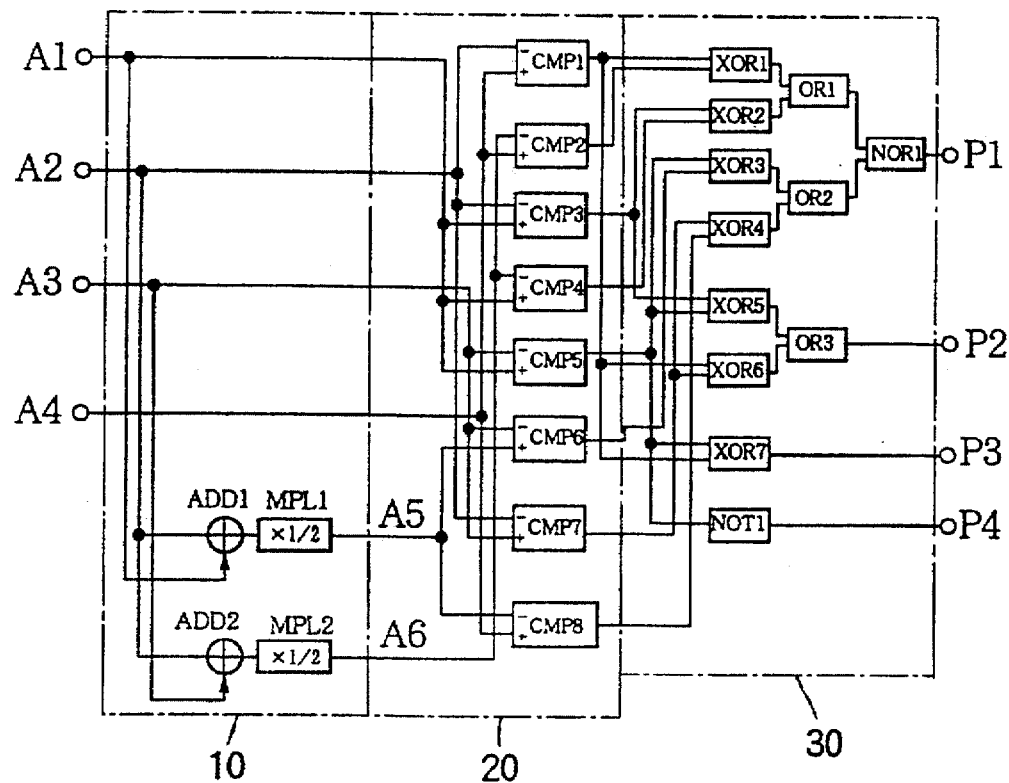

FIGS. 12A, 12B and 12C schematically show a third embodiment of the inventive absolute encoder. The absolute encoder has a movable member formed with parallel tracks, each of which is formed with a periodic bright and dark pattern. FIG. 12A shows one track T. As shown in the figure, this track T linearly moves in a linear encoder. Four number of photodetectors A1, A2, A3 and A4 are arranged along the one track T. In this embodiment, the photodetectors A1–A4 have a length identical to half of one period of the bright and dark pattern along the track. Further, the photodetectors A1, A2, A3 and A4 are arranged sequentially such that their phase difference is set to 90°. Such a construction is identical to the FIG. 1A arrangement.

The four photodetectors receive an illuminating light through the bright and dark pattern to output detection signals from the track T. FIG. 12B shows outputs from the photodetectors. The respective detection signals are denoted by the same references A1, A2, A3 and A4 of the corresponding photodetectors. As shown, the detection signals A1–A4 have the same period and a common triangular waveform, which is successively phase-shifted by a given shift amount in terms of an electric phase angle 90°. In this embodiment, the four detection signals of the triangular waveform are used as they are for primary wave signals (hereinafter, triangular wave signals). Further, the primary wave signals are processed to synthesize two secondary wave signals having a trapezoidal waveform (thus, the secondary wave signal may be referred to as "trapezoidal wave signal") and being phase-shifted from the triangular wave signals by half (45°) of the given shift amount (90°). In the FIG. 12B graph, these trapezoidal wave signals are denoted by A5 and A6. As seen from the waveforms of FIG. 12B, the primary triangular wave signals A1–A4 have a relative phase difference of 90°, while the secondary trapezoid wave signals A5 and A6 are phase-shifted by 45° from the triangular wave signals A1–A4. The primary and secondary wave signals have different waveforms from each other.

FIG. 12C shows a construction of the processing circuit connected to the four photodetectors. The processing circuit has a wave-forming part (input part) 10, a comparator part 20 and a logic part 30. The wave-forming part 1 receives the detection signals A1–A4 to provide a plurality of primary wave signals having the same period but having different phases. In this embodiment, four number of the detection signals are received as they are to directly provide respective primary triangular wave signals. Therefore, this part corresponds to the input part of the first embodiment shown in FIG. 1C. The wave-forming part 10 further synthesizes the two secondary wave signals which are phase-shifted by a half phase difference from the primary triangular wave signals A1–A4. In this embodiment, a pair of adders ADD1 and ADD2 and a pair of multiplicators MPL1 and MPL2 having a multiplication factor 0.5 are used to synthesize the two secondary trapezoidal wave signals A5 and A6 from the primary triangular wave signals A1–A4. The comparator part, 20 includes eight number of comparators CMP1–CMP8. The part 20 comparatively processes the triangular wave signals A1–A4 and the trapezoidal wave signals A5 and A6 with each other to produce a plurality of rectangular wave signals which are phase-shifted from one another. The logic part 30 is composed of seven exclusive logical summation devices XOR1–XOR7, three logical summation devices OR1–OR3, one negative logical summation device NOR1 and one negative device NOT1. The last part 30 logically processes the eight rectangular wave signals with each other to output four number of bit signals P1–P4 from the one track T.

Figure 13:
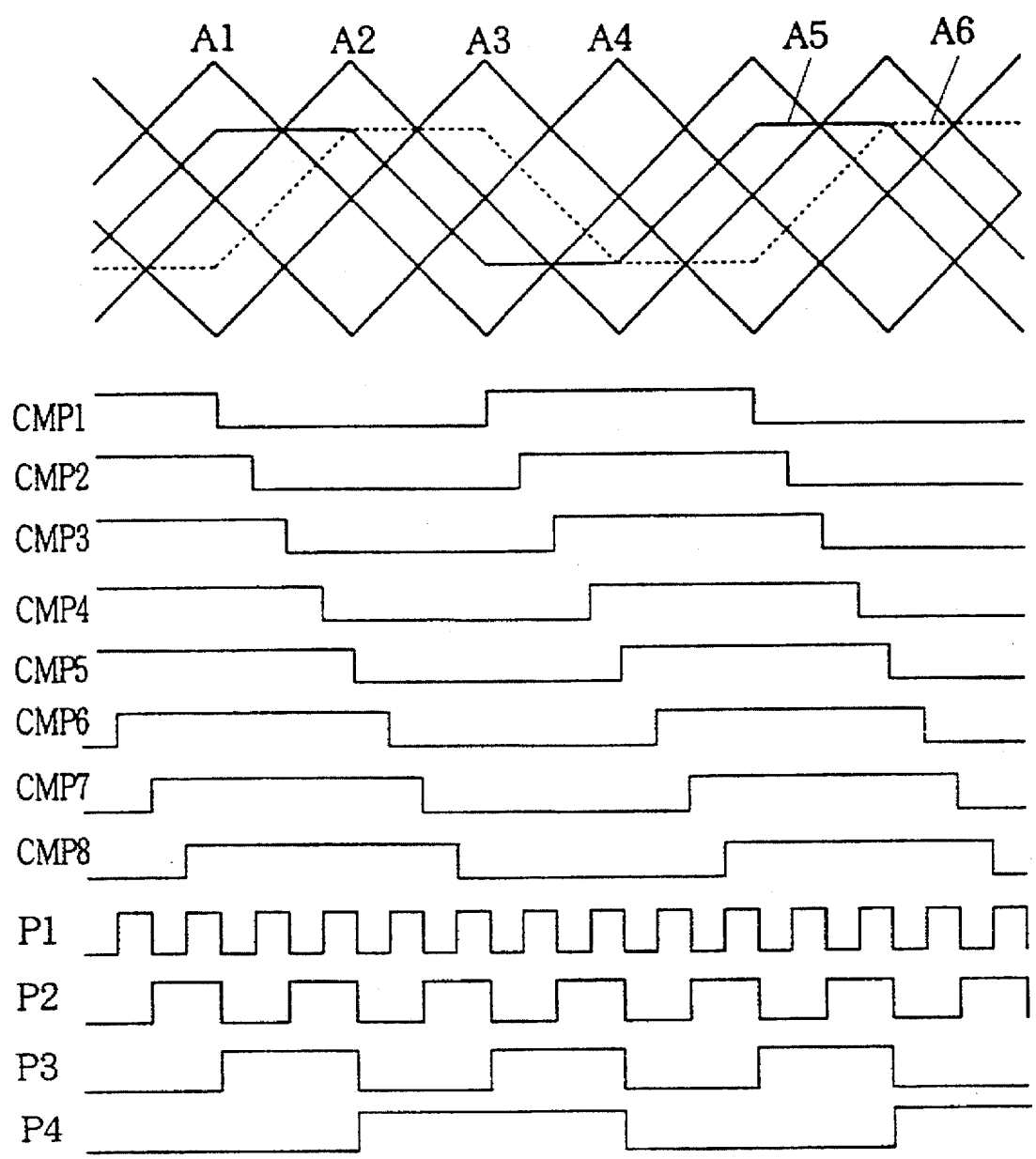
FIG. 13 is a waveform diagram illustrating operation of the third embodiment of the absolute encoder shown in FIGS. 12A, 12B and 12C.

Referring to FIG. 13, detailed description is given for operation of the processing circuit shown in FIG. 12C. The primary triangular wave signals A1–A4 are sequentially phase-shifted by the electric phase angle 90°. The primary triangular wave signals A1 and A2 are added to each other by ADD1 in the wave-forming part 10. The added result is multiplied by the factor 0.5 through MPL1 to derive the secondary trapezoidal wave signal A5. Similarly, the triangular signals A2 and A3 are added to each other by ADD2. The added result is multiplied by factor 0.5 through MPL2 to thereby derive the other secondary trapezoidal wave signal A6. As shown in the FIG. 13 chart, the trapezoidal wave signals A5 and A6 are phase-shifted by half of a phase difference among the triangular signals A1–A4. Next, the triangular wave signals A4 and A2 are compared to each other by CMP1 in the comparator part 20 to produce the first rectangular wave signal CMP1. In order for better reading, the rectangular wave signal and the corresponding comparator are labeled by the same reference. In similar manner, A4 and A6 are compared with each other by CMP2 to form the second rectangular wave signal. A1 and A2 are mutually compared CMP3 to form the third rectangular wave signal. A1 and A6 are mutually compared by CMP4 to form the fourth rectangular wave signal. A1 and A3 are mutually compared by CMP5 to form the fifth rectangular wave signal. A5 and A3 are mutually compared by CMP6 to form the sixth rectangular wave signal. A3 and A2 are compared by CMP7 to form the seventh rectangular wave signal. Lastly, A4 and A5 are mutually compared by CMP8 to form the eighth rectangular wave signal. These first through eighth rectangular wave signals CMP1–CMP8 are sequentially phase-shifted by an electric phase angle of 22.5°. In the logic part 30, the rectangular wave signals CMP1 and CMP2 are subjected to the exclusive logical summation by XOR1. The rectangular wave signals CMP3 and CMP4 are subjected to the exclusive logical summation by XOR2. The rectangular wave signals CMP5 and CMP6 are subjected to the exclusive logical summation by XOR3. The rectangular wave signals CMP7 and CMP8 are subjected to the exclusive logical summation by XOR4. The rectangular wave signals CMP3 and CMP5 are subjected to the exclusive logical summation by XOR5. The rectangular wave signals CMP1 and CMP7 are subjected to the exclusive logical summation by XOR6. The rectangular wave signals CMP1 and CMP5 are subjected to the exclusive logical summation by XOR7. The rectangular wave signal CMP5 is negated by NOT1. Further, the outputs from XOR1 and XOR2 are logically summed by OR1. The outputs from XOR3 and XOR4 are logically summed by OR2. The outputs from OR1 and OR2 are subjected to the negative logical summation by NOR1 to thereby derive the first bit signal P1. The outputs of XOR5 and XOR6 are logically summed by OR3 to thereby derive the second bit signal P2. The output of XOR7 is directly used for the third bit signal P3. The output of NOT1 is directly used for the fourth bit signal P4. As shown in the figure, P2 has a period twice as much as P1. P3 has a period four times as much as P1. P4 has a period eight times as much as P1.

Figure 14:
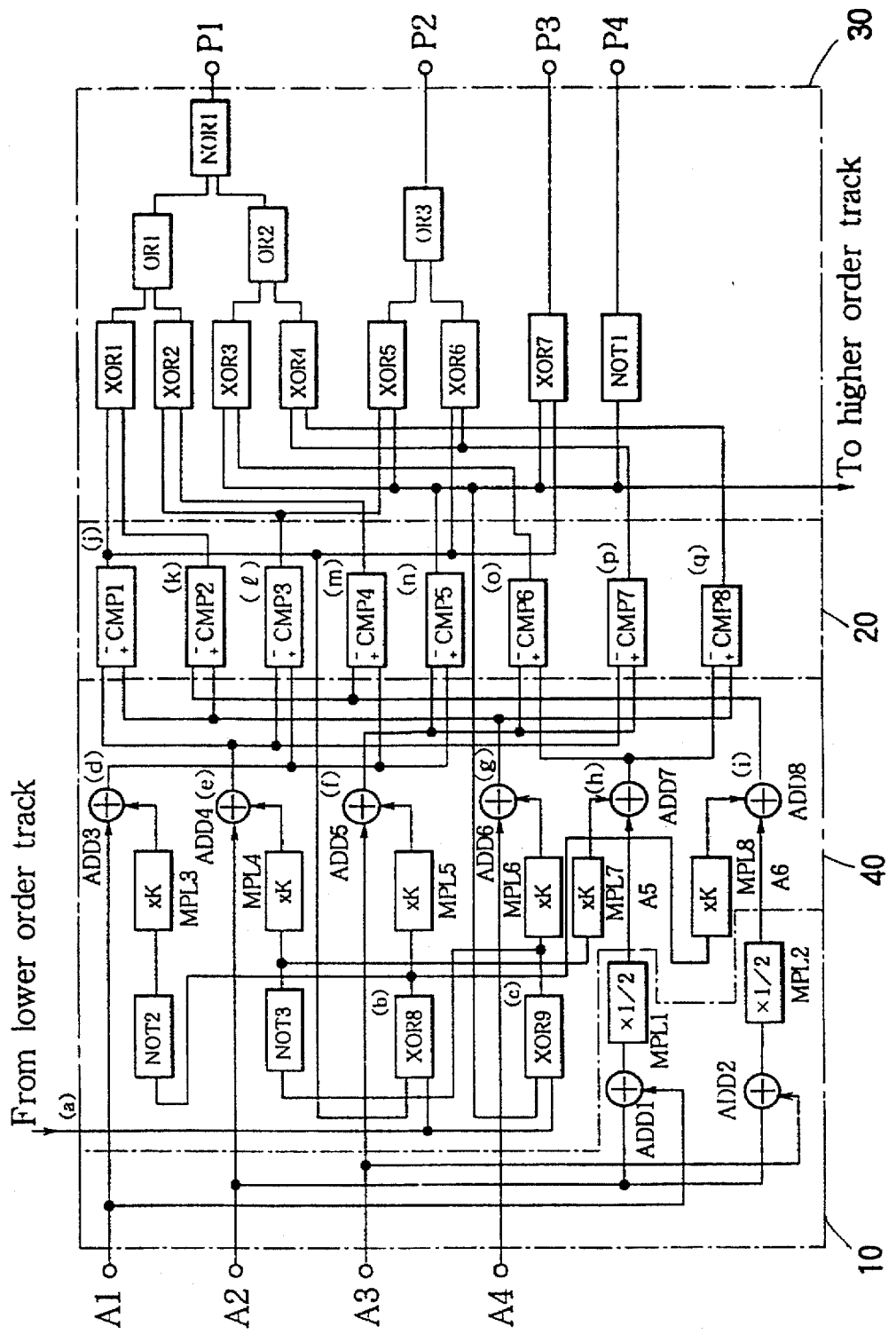
FIG. 14 is a circuit diagram showing a fourth embodiment of the inventive absolute encoder.

FIG. 14 shows another processing circuit integrated into a fourth embodiment of the inventive absolute encoder. If the processing circuit shown in FIG. 12C is applied as it is to each of parallel tracks, lower and higher bit signals may not be synchronized with each other to cause a reading error due to positional variation between the bright and dark pattern and the photodetector, or due to fluctuation in a voltage level of the detection signal. In view of this, the synchronization function is provided in the present embodiment. Namely, a modulator part 40 is interposed between the wave-forming part 10 and the comparator part 20. The modulator part 40 modulates the triangular wave signals A1, A2, A3 and A4 and the trapezoidal wave signals A5 and A6 in response to a periodic signal (a) transferred from another processing circuit assigned to a lower order track so as to synchronize higher order bit signals with lower order bit signals. The remaining portions of the present processing circuit has a similar structure as that of the previous processing circuit shown in FIG. 12C. Thus, corresponding parts are denoted by the same reference for better understanding. The modulator part 40 is comprised of two negative elements NOT1 and NOT2, two exclusive logical summation elements XOR8 and XOR9, six multiplicators MPL3–MPL8 set with a multiplication factor K, and six adders ADD3–ADD8. The pair of XOR8 and XOR9 constitute together a means for carrying out the exclusive logical summation of the periodic signal (a) from the lower order track and respective one of two rectangular wave signals which are fed back from the comparator part 20 so as to form sync signals (b) and (c), respectively. Further, the set of NOT2, NOT3, MPL3–MPL8, and ADD3–ADD8 constitute altogether a means for adding the sync signal (b) or (c) to the respective one of the triangular and trapezoidal wave signals A1–A6 by a given ratio (set by the multiplication factor K) to produce four modulated triangular wave signals (d), (e), (f) and (g) and two modulated trapezoidal wave signals (h) and (i).

Figure 15:
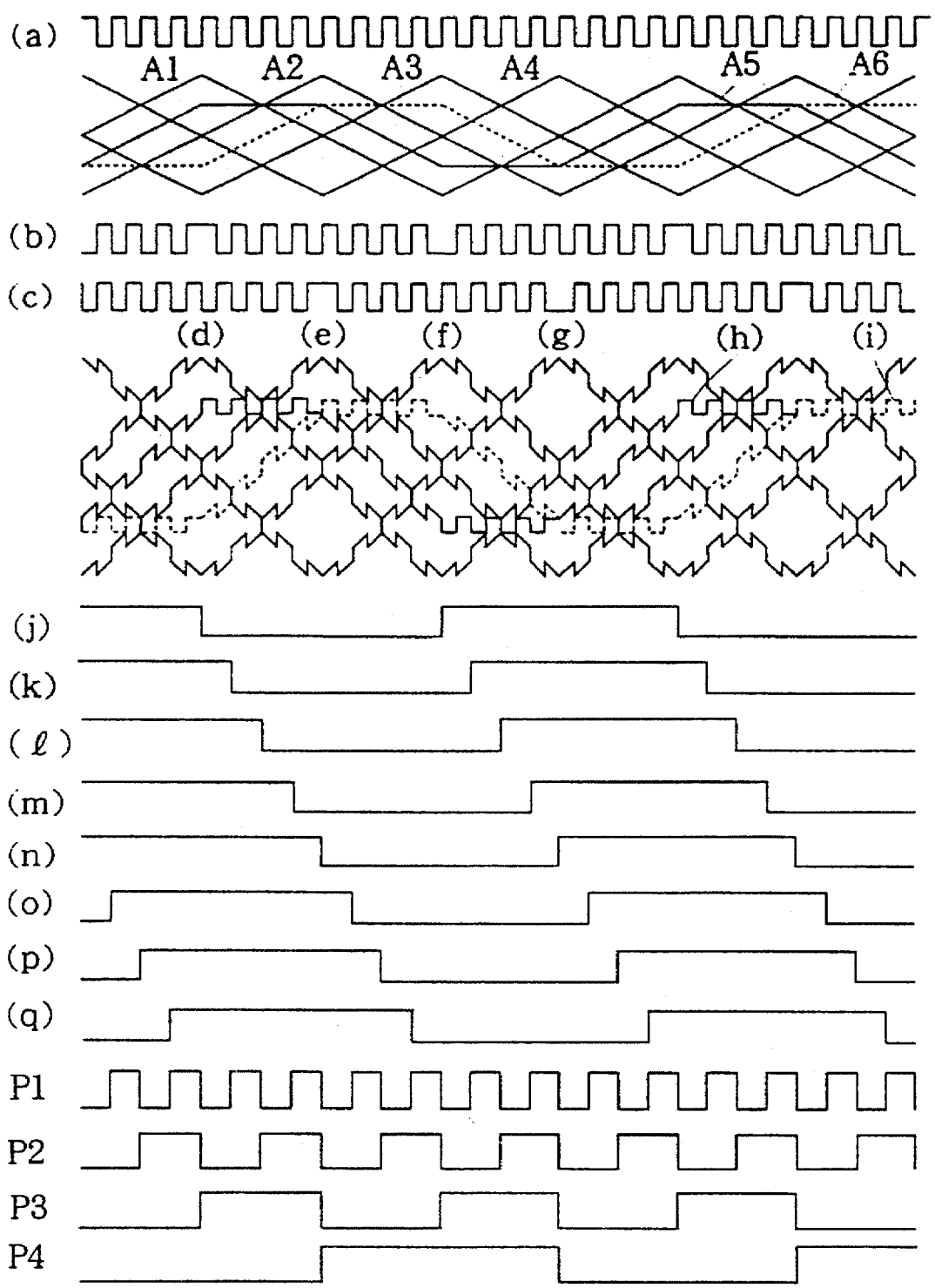
FIG. 15 is a waveform diagram illustrating operation of the fourth embodiment shown in FIG. 14.

FIG. 15 is a timing chart illustrating the operation of the processing circuit shown in FIG. 14. As shown, the periodic signal (a) provided from the lower order track has a rectangular waveform and a given short period. On the other hand, the triangular wave signals A1, A2, A3 and A4 and the trapezoidal wave signals A5 and A6 have a period 16 times as much as the periodic signal (a). In the modulator part 40, XOR8 carries out the exclusive logical summation of the periodic signal (a) and the first rectangular wave signal (j) fed back from CMP1 so as to produce the first sync signal (b). The first sync signal (b) has leading and trailing edges which are synchronized with those of the periodic signal (a). XOR9 carries out the exclusive logical summation of the periodic signal (a) and the fifth rectangular wave signal (n) fed back from CMP5 to produce the second sync signal (c). Next, the first sync signal (b) is subjected to the negative process by NOT2, and is further subjected to the multiplication process by MPL3. The thus processed result and the triangular wave signal A1 are added to each other by ADD3 to produce the modulated triangular wave signal (d) corresponding to the original triangular wave signal A1. As shown in the figure, the modulated triangular wave signal (d) has a vertical step in a slope of the waveform in synchronization with the leading or trailing edge of the periodic signal (a). Further, the second sync signal (c) is subjected to the negative process by NOT3, and is then multiplicated by MPL4. This result and the original triangular wave signal A2 are added to each other by ADD4 to produce the corresponding modulated triangular wave signal (e). The modulated triangular wave signal (e) has also a step synchronized with the leading or trailing edge of the periodic signal (a). In similar manner, the modulated triangular wave signal (f) is obtained from the initial triangular wave signal A3, the modulated triangular wave signal (g) is obtained from the initial triangular wave signal A4, the modulated trapezoidal wave signal (h) is obtained from the initial trapezoidal wave signal A5, and the modulated trapezoidal wave signal (i) is obtained from the initial trapezoidal wave signal A6. All of the modulated wave signals have the vertical steps in the middle of the slope of the waveform.

Thereafter, the modulated triangular and trapezoidal wave signals are processed by the comparator part 20 in place of the original triangular and trapezoidal wave signals in manner similar to the third embodiment, thereby producing the eight number of the rectangular wave signals (j), (k), (l), (m), (n), (o), (p) and (q). Further, these eight rectangular wave signals are logically processed by the logic part 30 to derive the four bit signals P1–P4 in manner similar to the third embodiment. The first bit signal P1 has a period twice as much as the periodic signal (a). The fourth bit signal P4 has a period 16 times as much as the periodic signal (a). These bit signals are composed of a train of rectangular pulses each having leading and trailing edges exactly synchronized to the leading or trailing edge of the periodic signal (a). In this embodiment, the modulated triangular and trapezoidal wave signals are crossed to each other at their steps which are synchronized with the periodic signal (a) to exactly invert the output of CMPs even if a certain variation of amplitude and phase occurs in the outputs from the photodetectors A1–A4.

Figure 16:
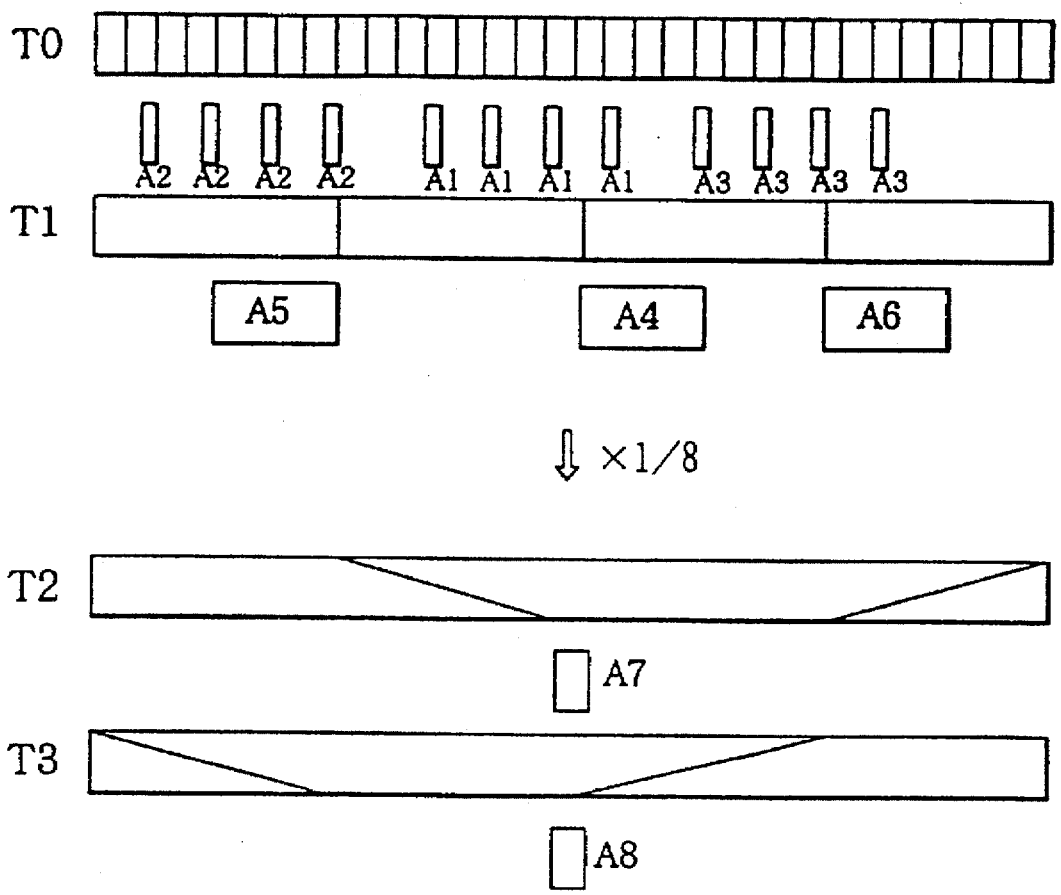
FIG. 16 is a track arrangement diagram showing another practical example of the inventive absolute encoder.

FIG. 16 shows another practical example of the inventive absolute encoder. A set of four parallel tracks T0, T1, T2 and T3 are formed in a movable member from lower to higher orders so as to derive ten number of bit signals P0–P9. Namely, the absolute encoder has a certain positional resolution which realizes $2^{10}$ number of addresses. On the other hand, the previous example of FIG. 5 has likewise the four number of tracks T0, T1, T2 and T3, but can produce only nine number of bit signals P0–P8. As shown in the figure, a first set of photodetectors A1, a second set of photodetectors A2 and a third set of photodetectors A3 are arranged along the lowest order track T0. These photodetectors A1, A2 and A3 have a length or span, in the track direction, dimensioned ¼ of one period of the bright and dark pattern. Therefore, the individual photodetector is narrower than the previous photodetector used in the FIG. 12A embodiment. Therefore, the photodetectors A1, A2 and A3 output a detection signal not having a triangular waveform but having a trapezoidal waveform. The set of photodetectors A1 and the set of photodetectors A2 have a relative phase difference of 90°. The set of photodetectors A1 and the set of photodetectors A3 have a relative phase difference of 180°. Three pieces of photodetectors A4, A5 and A6 are disposed along the track T1 next to the lowest order track T0. These photodetectors have a length, in the track direction, dimensioned ¼ of one period of the bright and dark pattern formed along the track T1. These photodetectors likewise output a detection signal having a trapezoidal waveform. The photodetectors A4 and A5 have a spatial phase difference of 90°. The photodetectors A4 and A6 have a spatial phase difference of 180°. The next track T2 has a bright and dark pattern in a gradation form which gradually changes its transmittance from bright to dark along the track, hence a corresponding photodetector A7 can output a detection signal having a trapezoidal waveform containing a slope. In this example, this gradation pattern comprises a split gradation pattern having a bright section and a dark section, which are separated from each other by a split line extending obliquely in the track. The split line comprises a diagonal linear line formed in the straight or linear track T2. The last track T3 has a bright and dark pattern which is shifted from the track T2 by a spatial phase angle of 90°, while a corresponding photodetector A8 is disposed in the same spatial phase relation to the photodetector A7. This arrangement is substantially identical to the previous example shown in FIG. 5. A different point is in that the bright and dark patterns formed in the tracks T2 and T3 have a period 16 times as long as the bright and dark pattern formed in the track T1. For better illustration, the tracks T2 and T3 are drawn in the figure by a contraction scale of ⅛ in the track direction relative to tracks T0 and T1.

Figure 17:
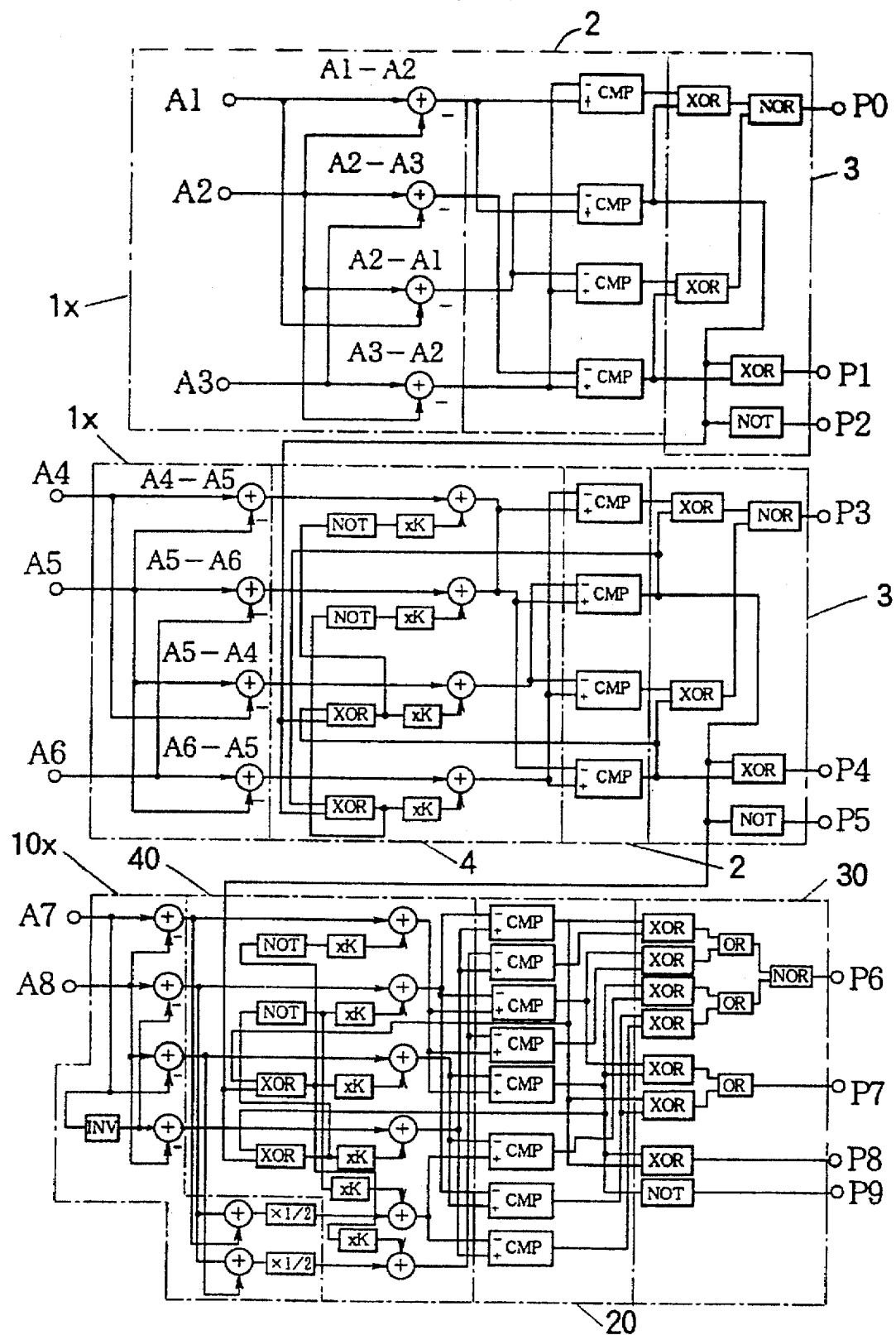
FIG. 17 is a block diagram showing a construction of processing circuits integrated to the FIG. 16 example.
Figures 18, 19, 20:
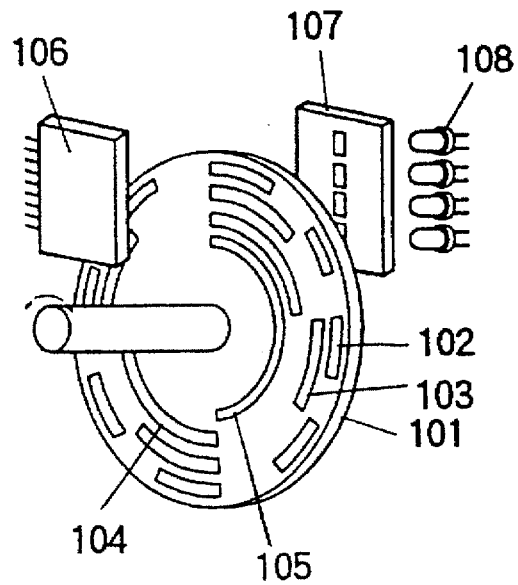
FIG. 18 is a perspective view of a conventional absolute encoder.
FIG. 19 is a track diagram of the bright and dark pattern according to a regular binary code.
FIG. 20 is a track diagram of the bright and dark pattern according to a Gray code.
Figure 21:
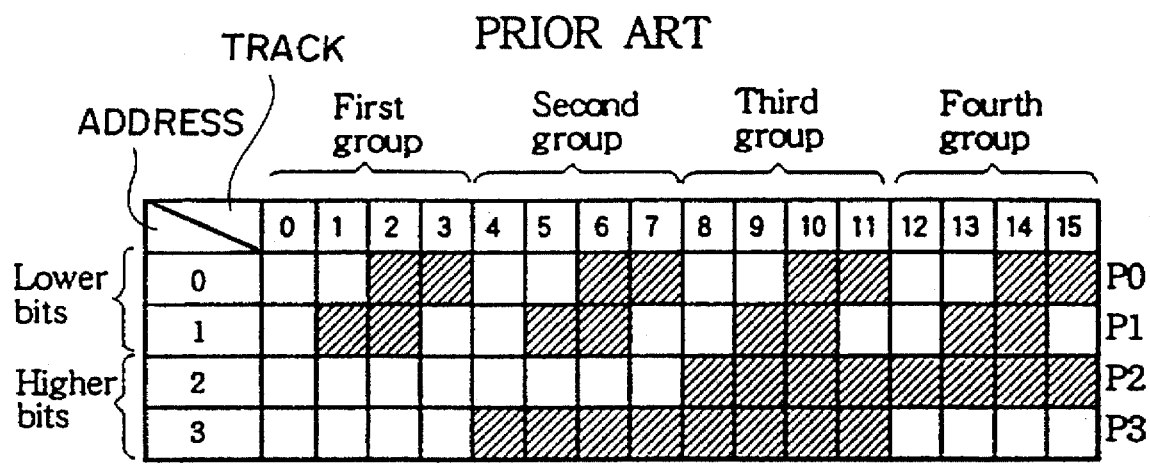
FIG. 21 is a track diagram of the bright and dark pattern according to a binary coded quaternary code.
Figure 22:
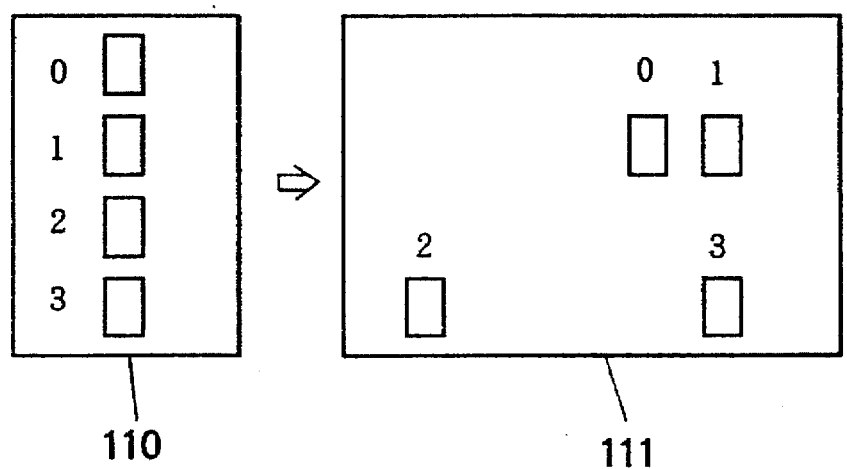
FIG. 22 is a schematic diagram showing an array of photodetectors applied to the bright and dark pattern according to the binary coded quaternary code.

FIG. 17 shows a multi-stage structure of the processing circuits designed correspondingly to the track arrangement of FIG. 16. As shown, a first stage of the processing circuit is provided to the track T0. This processing circuit is structurally identical to the first stage of the previous example shown in FIG. 7, and therefore outputs three number of the bit signals P0–P2 from the one track T0. The processing circuit includes an input part 1x, a comparator part 2 and a logic part 3. The input part 1x includes four subtractors to process the trapezoidal detection signals A1–A3 to form four number of triangular wave signals A1–A2, A2–A3, A2–A1 and A3–A2. The comparator part 2 contains four number of comparators which mutually compare the four triangular wave signals to produce four number of rectangular wave signals. The logic part 3 includes three exclusive logical summation elements, one negative element and one negative logical summation element for logically processing the four rectangular wave signals to produce the three bit signals P0–P2. This first stage processing circuit is assigned to the lowest order track T0 so that the synchronization process is not required and therefore the modulator part is eliminated.

The second stage processing circuit is provided to the second order track T1. This processing circuit is basically identical to the first stage processing circuit. Therefore, corresponding parts are labeled by the same references for better understanding. A different point is in that a modulator part 4 is interposed between the input part 1x and the comparator part 2. The modulator part 4 processes the four triangular wave signals in synchronization with the periodic signal (a) fed from a comparator contained in the first stage processing circuit to form the respective modulated triangular wave signals. These modulated signals are subjected to the comparative process and the logical process to derive the three bit signals P3–P5. By such a construction, the bit signals P3–P5 from the second track T1 can be synchronized with the bit signals P0–P2 from the first track T0.

A processing circuit of the third stage is provided for the pair of tracks T2 and T3. This processing circuit is basically identical to the fourth embodiment shown in FIG. 14, and includes similar modulator part 40, comparator part 20 and logic part 30. However, the wave-forming part (input part) 10x is modified from the basic wave-forming part 10 into a similar structure as the input part 1x contained in the processing circuits of the first and second stages. The wave-forming part 10x receives the trapezoidal detection signals A7 and A8 to form the four primary ones of the triangular wave signals. Further, the four triangular wave signals are processed to derive the two secondary ones of the trapezoidal wave signals. Specifically, the wave-forming part is provided with an inverter INV for inverting the detection signal A7 to form an opposite phase signal. The four primary triangular wave signals are formed by using the detection signals A7, A8 and the opposite phase signal. In the highest order tracks T2 and T3, if the photodetectors A7 and A8 were designed likewise the photodetectors A1–A6, the photodetectors A7 and A8 should need an excessively long span dimensioned ⅛ of one period of the elongated bright and dark pattern. In view of this, as shown in FIG. 16, the tracks T2 and T3 are formed with the gradation pattern of bright and dark, while the photodetectors A7 and A8 are scaled down to enable outputting of the trapezoidal detection signals.

As described above, according to the invention, a plurality of detection signals are admitted from photodetectors to provide a plurality of triangular wave signals having the same period but different phases. These triangular wave signals are mutually compared to produce a plurality of rectangular wave signals having different phases. These rectangular wave signals are logically processed with one another to output at least three bit signals per one track. Accordingly, at least one bit signal can be additionally produced per one track as compared to the prior art, thereby contributing to scale-down and cost-down of the absolute encoder. Alternatively, the detection signals are received to provide a plurality of primary wave signals (for example, triangular wave signals) having the same period but being phase-shifted sequentially by a given shift amount. Further, the primary wave signals are processed to provide a plurality of secondary wave signals (for example, trapezoidal wave signals) having a different waveform than the primary wave signals and being phase-shifted from the primary wave signals by half of the given shift amount. These primary and secondary wave signals are mutually compared to produce a plurality of rectangular wave signals having different phases. These rectangular wave signals are logically processed with each other to output at least four number of bit signals per one track, thereby contributing to cost-down and size-down of the absolute encoder. Further, the triangular wave signals are modulated in response to the periodic signal fed from the lower order track part so as to synchronize the lower and higher order bit signals with each other. By this, a reading error can be avoided between the parallel tracks.

What is claimed is:

1. An absolute encoder comprising:
a movable member having a plurality of tracks arranged from higher to lower orders, each track having a bright and dark pattern, a plurality of photodetectors for receiving a light through the bright and dark pattern of one track to output a plurality of detection signals associated with the one track; and a processing circuit for processing the detection signals to produce bit signals which indicates a position of the movable member, wherein the processing circuit comprises input means receptive of the detection signals for producing a plurality of triangular wave signals having the same period but different phases, each wave signal having both a linear rising slope and a linear falling slope, and comparator means for comparatively processing the triangular wave signals with each other to produce a plurality of rectangular wave signals having different phases, and logic means for logically processing the rectangular wave signals with each other to output at least three bit signals from one track, wherein the processing circuit is assigned to a higher order track and includes modulator means connected between the input means and the comparator means for modulating the triangular wave signals according to a periodic signal which is fed from another processing circuit assigned to a lower order track so as to synchronize a bit signal of the higher order track with another bit signal of the lower order track.

2. An absolute encoder according to claim 1, wherein the modulator means comprises means for logically processing a rectangular signal fed back from the comparator means with the periodic signal to form a sync signal, and means for adding the sync signal and respective one of the triangular wave signals with one another by a given ratio to produce the modulated triangular wave signal.

3. An absolute encoder according to claim 1, wherein the input means includes means for adding or subtracting a pair of detection signals having a trapezoidal waveform and a phase difference of 90° with each other so as to produce a triangular wave signal.

4. An absolute encoder according to claim 1, wherein the input means includes means for inverting a detection signal to form an opposite phase signal, and means for processing another detection signal and the opposite phase signal so as to produce a triangular wave signal.

5. An absolute encoder according to claim 1, wherein the bright and dark pattern comprises a gradation pattern which gradually changes from bright to dark, effective to enable the input means to form a slope of the triangular wave signal.

6. An absolute encoder according to claim 5, wherein the gradation pattern comprises an alternate arrangement of a bright segment and a dark segment such that a duty ratio thereof gradually changes along the track.

7. An absolute encoder according to claim 5, wherein the gradation pattern comprises a continuous gradation pattern such that an optical density continuously changes from bright to dark along the track.

8. An absolute encoder according to claim 5, wherein the gradation pattern comprises a split gradation pattern having a bright section and a dark section, which are separated from each other by a split line extending obliquely in the track.

9. An absolute encoder according to 8, wherein the split line comprises a diagonal linear line formed in a straight track.

10. An absolute encoder according to 8, wherein the split line comprises a vortical line formed in a circular track.

11. An absolute encoder according to claim 10, wherein the vortical line comprises a spiral line defined by R=a·√.θ where R denotes a radius, a denotes a constant and θ denotes an angle.

12. An absolute encoder according to claim 1, wherein the input means comprises means receptive of the detection signals for producing a plurality of triangular wave signals having the same period but different phases which are sequentially shifted by a given shift amount and for additionally producing a plurality of trapezoidal wave signals which are shifted from the triangular wave signals by half of the given shift amount, the comparator means comprises means for comparatively processing the triangular wave signals and the trapezoidal wave signals altogether to produce a plurality of rectangular wave signals having different phases, and the logic means comprises means for logically processing the rectangular wave signals with each other to output four bit signals from one track.

13. An absolute encoder comprising:

a movable member having a plurality of tracks arranged from higher to lower orders, each track having a bright and dark pattern; photodetectors for receiving a light through a bright and dark pattern to output detection signals associated to each track; and a processing circuit for processing the detection signals to produce bit signals which indicates a position of the movable member, wherein the processing circuit comprises wave-forming means receptive of the detection signals for producing a plurality of primary wave signals having the same period but different phases which are sequentially shifted by a given shift amount and for further producing a plurality of secondary wave signals which have a different waveform than the primary wave signals and which are phase-shifted from the primary wave signals by half of the given shift amount, comparator means for comparatively processing the primary and secondary wave signals with each other to produce a plurality of rectangular wave signals having different phases, and logic means for logically processing the rectangular wave signals with each other to output at least four bit signals, wherein the wave-forming means comprises means for producing a plurality of primary wave signals having a triangular waveform and for further producing secondary wave signals having a trapezoidal waveform which is obtained by either of adding and subtracting the primary wave signals.

14. An absolute encoder according to claim 13, wherein the processing circuit is assigned to a higher order track and includes modulator means connected between the wave-forming means and the comparator means for modulating the primary and secondary wave signals according to a periodic signal which is fed from another processing circuit assigned to a lower order track so as to synchronize a bit signal of the higher order track with another bit signal of the lower order track.

15. An absolute encoder according to claim 14, wherein the modulator means comprises means for logically processing a rectangular signal fed back from the comparator means with the periodic signal to form a sync signal, and means for adding the sync signal and respective one of the primary and secondary wave signals with one another by a given ratio to produce the modulated triangular wave signal.

16. An absolute encoder according to claim 13, wherein the wave-forming means includes means for adding or subtracting a pair of detection signals having a trapezoidal waveform and a phase difference of 90° with each other so as to produce a primary wave signal having the triangular waveform.

17. An absolute encoder according to claim 13, wherein the wave-forming means includes means for inverting a detection signal to form an opposite phase signal, and means for processing another detection signal and the opposite phase signal so as to produce a primary wave signal.

18. An absolute encoder according to claim 13, wherein the bright and dark pattern comprises a gradation pattern which gradually changes from bright to dark, effective to enable the wave-forming means to form a slope of the primary wave signal.

19. An absolute encoder according to claim 18, wherein the gradation pattern comprises an alternate arrangement of a bright segment and a dark segment such that a duty ratio thereof gradually changes along the track.

20. An absolute encoder according to claim 18, wherein the gradation pattern comprises a continuous gradation pattern such that an optical density continuously changes from bright to dark along the track.

21. An absolute encoder according to claim 18, wherein the gradation pattern comprises a split gradation pattern having a bright section and a dark section, which are separated from each other by a split line extending obliquely in the track.

22. An absolute encoder according to claim 21, wherein the split line comprises a diagonal linear line formed in a straight track.

23. An absolute encoder according to claim 21, wherein the split line comprises a vortical line formed in a circular track.

24. An absolute encoder according to claim 23, wherein the vortical line comprises a spiral line defined by $$R = a \cdot \sqrt{\theta}$$

where R denotes a radius, a denotes a constant and θ denotes an angle.

25. An absolute encoder comprising:

a movable member having a plurality of tracks arranged from higher to lower orders, each track having a bright and dark pattern; a plurality of photodetectors for receiving a light through a bright and dark pattern of one track to output a plurality of detection signals associated with the one track; and a processing circuit for processing the detection signals to produce bit signals which indicate a position of the movable member, wherein the processing circuit comprises input means receptive to the detection signals for producing at least four triangular wave signals having the same period but different phases, each wave signal having both a linear rising slope and a linear falling slope, comparator means for comparatively processing the four triangular wave signals with each other to produce a plurality of rectangular wave signals having different phases, and logic means for logically processing the rectangular wave signals with each other to output at least three bit signals from one track.

26. An absolute encoder according to claim 25, wherein the processing circuit is assigned to a higher order track and includes modulator means connected between the input means and the comparator means for modulating the triangular wave signals according to a periodic signal which is fed from another processing circuit assigned to a lower order track so as to synchronize a bit signal of the higher order track with another bit signal of the lower order track.

27. An absolute encoder according to claim 26, wherein the modulator means comprises means for logically processing a rectangular signal fed back from the comparator means with the periodic signal to form a sync signal, and means for adding the sync signal and respective one of the triangular wave signals with one another by a given ratio to produce the modulated triangular wave signal.

28. An absolute encoder according to claim 25, wherein the input means includes means for adding or subtracting a pair of detection signals having a trapezoidal waveform and a phase difference of 90° with each other so as to produce a triangular wave signal.

29. An absolute encoder according to claim 25, wherein the input means includes means for inverting a detection signal to form an opposite phase signal, and means for processing another detection signal and the opposite phase signal so as to produce a triangular wave signal.

30. An absolute encoder according to claim 25, wherein the bright and dark pattern comprises a gradation pattern which gradually changes from bright to dark, effective to enable the input means to form a slope of the triangular wave signal.

31. An absolute encoder according to claim 30, wherein the gradation pattern comprises an alternate arrangement of a bright segment and a dark segment such that a duty ratio thereof gradually changes along the track.

32. An absolute encoder according to claim 30, wherein the gradation pattern comprises a continuous gradation pattern such that an optical density continuously changes from bright to dark along the track.

33. An absolute encoder according to claim 32, wherein the gradation pattern comprises a split gradation pattern having a bright section and a dark section, which are separated from each other by a split line extending obliquely in the track.

34. An absolute encoder according to claim 33, wherein the split line comprises a diagonal linear line formed in a straight track.

35. An absolute encoder according to claim 33, wherein the split line comprises a vortical line formed in a circular track.

36. An absolute encoder according to claim 35, wherein the vortical line comprises a spiral line defined by $R=a\cdot\sqrt{\theta}$ where R denotes a radius, a denotes a constant and $\theta$ denotes an angle.

37. An absolute encoder according to claim 25, wherein the input means comprises means receptive of the detection signals for producing a plurality of triangular wave signals having the same period but different phases which are sequentially shifted by a given shift amount and for additionally producing a plurality of trapezoidal wave signals which are shifted from the triangular wave signals by half of the given shift amount, the comparator means comprises means for comparatively processing the triangular wave signals and the trapezoidal wave signals altogether to produce a plurality of rectangular wave signals having different phases, and the logic means comprises means for logically processing the rectangular wave signals with each other to output four bit signals from one track.

* * * * *